(12) United States Patent
Mahmud et al.

(10) Patent No.: US 12,301,139 B2
(45) Date of Patent: May 13, 2025

(54) 1D/2D HYBRID PIEZOELECTRIC NANOGENERATOR AND METHOD FOR MAKING SAME

(71) Applicant: SHIMCO NORTH AMERICA INC., Cambridge (CA)

(72) Inventors: Alam Mahmud, Waterloo (CA); Asif Abdullah Khan, Waterloo (CA); Dayan Ban, Waterloo (CA); Peter Voss, Cambridge (CA)

(73) Assignee: SHIMCO NORTH AMERICA INC., Cambridge (CA)

(*) Notice: Subject to any disclaimer, the term of this patent is extended or adjusted under 35 U.S.C. 154(b) by 798 days.

(21) Appl. No.: 16/430,820

(22) Filed: Jun. 4, 2019

(65) Prior Publication Data
US 2020/0204089 A1 Jun. 25, 2020

Related U.S. Application Data

(60) Provisional application No. 62/917,121, filed on Nov. 21, 2018, provisional application No. 62/763,096, filed on Jun. 4, 2018.

(51) Int. Cl.
*H02N 1/04* (2006.01)
*H01L 41/08* (2006.01)
(Continued)

(52) U.S. Cl.
CPC .............. *H02N 2/188* (2013.01); *H02N 1/04* (2013.01); *H02N 2/22* (2013.01); *H10N 30/078* (2023.02);
(Continued)

(58) Field of Classification Search
CPC ..... H01L 41/37; H01L 41/183; H01L 41/318; H01L 41/319; H01L 41/0815;
(Continued)

(56) References Cited

U.S. PATENT DOCUMENTS 9,067,821 B2 * 6/2015 Bleecher .................. C23C 4/10
10,199,560 B2 * 2/2019 Sirbuly .................. H01L 41/37
(Continued)

FOREIGN PATENT DOCUMENTS

EP 3319133 A1 5/2018

OTHER PUBLICATIONS

Montalvao, D.; Maia, N. M. M.; and Ribeiro, A. M. R. A review of vibration-based structural health monitoring with special emphasis on composite materials. Shock and Vibration Digest. 2006, vol. 38, No. 4, 295-326.
(Continued)

*Primary Examiner* — Dedei K Hammond
*Assistant Examiner* — Monica Mata
(74) *Attorney, Agent, or Firm* — NORTON ROSE FULBRIGHT CANADA LLP

(57) ABSTRACT

The present invention relates to a piezoelectric nanogenerator (PENG) that is capable of harvesting mechanical energy into electricity. The PENG comprises one dimensional (1D) and two dimensional (2D) nanostructures integrated together to form a composite nanostructure. A major advantage of the present invention is that the composite nanostructure provides enhanced electrical output and enhanced mechanical stability as compared to previously reported 1D or 2D nanostructures alone. Also described is a hybrid nanogenerator that combines the PENG with a triboelectric nanogenerator (TENG). A method of synthesizing the composite nanostructure PENG, in which the 1D and 2D nanostructures are grown together on the same substrate using a low temperature hydrothermal method is also described. The provided method is simple and cost-effective.

19 Claims, 20 Drawing Sheets

(51) Int. Cl.

| | |
|---|---|
| H01L 41/113 | (2006.01) |
| H01L 41/18 | (2006.01) |
| H01L 41/318 | (2013.01) |
| H01L 41/319 | (2013.01) |
| H01L 41/37 | (2013.01) |
| H02N 2/00 | (2006.01) |
| H02N 2/18 | (2006.01) |
| H10N 30/00 | (2023.01) |
| H10N 30/078 | (2023.01) |
| H10N 30/079 | (2023.01) |
| H10N 30/092 | (2023.01) |
| H10N 30/30 | (2023.01) |
| H10N 30/85 | (2023.01) |

(52) U.S. Cl.
CPC ......... *H10N 30/079* (2023.02); *H10N 30/092* (2023.02); *H10N 30/308* (2023.02); *H10N 30/708* (2024.05); *H10N 30/852* (2023.02)

(58) Field of Classification Search
CPC ........ H01L 41/1138; H02N 1/04; H02N 2/22; H02N 2/188; H10N 30/078; H10N 30/079; H10N 30/092; H10N 30/308; H10N 30/852; H10N 30/10516
USPC ......................................................... 310/339
See application file for complete search history.

(56) References Cited

U.S. PATENT DOCUMENTS

| | | | |
|---|---|---|---|
| 2007/0001581 A1* | 1/2007 | Stasiak | H01L 33/08 313/498 |
| 2012/0293047 A1 | 11/2012 | Wang et al. | |
| 2018/0040806 A1* | 2/2018 | Gong | C08J 9/0061 |

OTHER PUBLICATIONS

Brian, D. Vibration condition monitoring techniques for rotating machinery. The Shock and Vibration Digest. 1976, 8(12): 3.
Fan, W., Qiao, P. Z. Vibration-based damage identification methods: A review and comparative study. Structural Health Monitoring. 2010, vol. 10, No. 1, 83-111.
Wang, Z.L., Song, J.H. Piezoelectric nanogenerators based on zinc oxide nanowire arrays. Science. 2006, 312, 242-246.
Sodano, H.A., Inman, D.J., Park, G. A review of power harvesting from vibration using piezoelectric materials. The Shock and Vibration Digest. 2004, 36, 197-205.
Wang, X.D., Song, J.H., Liu, J., Wang, Z.L. Direct-current nanogenerator driven by ultrasonic waves. Science. 2007, 316, 102-105.
Wang, Z.L. Towards Self-Powered Nanosystems: From Nanogenerators to Nanopiezotronics. Advanced Functional Materials. 2008, 18, 3553-3567.
Yang, R., Qin, Y., Li, C., Zhu, G., Wang, Z.L. Flexible High-Output Nanogenerator Based on Lateral ZnO Nanowire Array. Nano Letters. 2010, 10, 3151-3155.
Kumiko Miyazaki, Nazrul Islam. Nanotechnology systems of innovation—An analysis of industry and academia research activities. Technovation. 2007, 27, 661-675.
Niemeyer C.M. Nanotechnology. Tools for the Biomolecular Engineer. Science. 2002, 297, 62-63.
C.M. Shea. Future management research directions in nanotechnology: A case study. J. Eng. Technol. Manage. 2005, 22, 185-200.
Kumar, N.R. A Review of Low-Power VLSI Technology Developments. Innovations in Electronics and Communication Engineering. Lecture Notes in Networks and Systems, vol. 7. Springer, Singapore.
Xu, S., Qin, Y., Xu, C. Wei, Y., Yang, R., Wang, Z.L. Self-powered nanowire devices. Nature Nanotechnology. 2010, 5, 366-373.
Sun, C., Shi, J., Bayerl, D., Wang, X.D. PVDF microbelts for harvesting energy from respiration. Energy & Environmental Science. 2011, 4, 4508-4512.
Wang, Z. L. Progress in piezotronics and piezo-phototronics. Advanced Materials. 2012, 24, 4632-4646.
Wang, Z.L., Kong, X.Y., Ding, Y., Gao, P., Hughes, W.L., Yang, R., Zhang, Y. Semiconducting and Piezoelectric Oxide Nanostructures Induced by Polar Surfaces. Advanced Functional Materials. 2004, 14, 943-956.
Yoon, G.C., Shin, K.S., Gupta, M.K., Lee, K.Y., Lee, J.H., Wang, Z.L., Kim, S.W. High-performance hybrid cell based on an organic photovoltaic device and a direct current piezoelectric nanogenerator. Nano Energy. 2015, 12, 547-555.
Wang, Q., Yang, D., Qiu, Y., Zhang, X., Song, W., Hu, L. Two-dimensional ZnO nanosheets grown on flexible ITO-PET substrate for self-powered energy-harvesting nanodevices. Applied Physics Letters. 2018, 112, 063906.
Greene, L. E., Law, M., Goldberger, J., Kim F., Johnson, J. C., Zhang, Y., Saykally, R. J., Yang, P. Low-Temperature Wafer-Scale Production of ZnO Nanowire Arrays. Angewandte Chemie International Edition. 2003, 42, 3031-3034.
Iheanacho, B.C. Optoelectronic Properties and Applications of 3-D Hybrid a-Si:H/ZnO Nanowire Structures. Ph.D. Dissertation, University of Waterloo, Waterloo, ON, Canada, 2017.
Pathirane, M. Flexible 3-Dimensional Hybrid ZnO Nanowire/a-Si:H Thin-Film Solar Cells. Ph.D. Dissertation, University of Waterloo, Waterloo, ON, Canada, 2016.
Ladanov, M., Ram, M. K., Matthews, G., Kumar, A. Structure and opto-electrochemical properties of ZnO nanowires grown on n-Si substrate. Langmuir. 2011, 27, No. 14, 9012-9017.
Wang, S.F., Tseng, T.Y., Wang, Y.R., Wang, C.Y., Lu, H.C., Shih, W.L. Effects of preparation conditions on the growth of ZnO nanorod arrays using aqueous solution method. International Journal of Applied Ceramic Technology. 2008, 5, No. 5, 419-429.
Cheng, J.P., Zhang, X.B., Luo, Z.Q. Oriented growth of ZnO nanostructures on Si and Al substrates. Surface & Coatings Technology. 2008, 202, 4681-4686.
Ishikawa, T., Matsumoto, K., Ysukawa, A., Kandori, K., Nakayama, T., Tsubota, T. Influence of metal ions on the formation of artificial zinc rusts. Corrosion Science. 2004, 46, 329-342.
Xu, F., Yuan, Z.Y., Du, G.H., Halasa, M., Su, High-yield synthesis of single-crystalline ZnO hexagonal nanoplates and accounts of their optical and photocatalytic properties. Applied Physics A. 2007, 86, 181-185.
Liu, G. Semiconductor Nanowire Based Piezoelectric Energy Harvesters: Modeling, Fabrication, and Characterization. Ph.D. Dissertation, University of Waterloo, Waterloo, ON, Canada, 2016.
Kim, K.H., Kumar, B., Lee, K.Y., Park, H.K., Lee, J.H., Lee, H.H., Jun, H., Lee, D., Kim, S.W. Piezoelectric two-dimensional nanosheets/ anionic layer heterojunction for efficient direct current power generation. Scientific Reports. 2013, 3, 2017, pp. 1-6.
Pradel, K., Wu, W., Ding, Y., Wang, Z.L. Solution-derived ZnO homojunction nanowire-films on wearable substrates for energy conversion and self-powered gesture recognition. Nano Letters. 2014, 14, 12, 6897-6905.
Liu, G., Abdel-Rahman, E., Ban, D. Performance optimization of pn homojunction nanowire based piezoelectric nanogenerators through control of doping concentration. Journal of Applied Physics. 2015, 118, 094307.
Lee, S., Bae, S. H., Lin, L., Yang, Park, Y. C., Kim, S. W., Cha, S. N., Kim, H. Y., Park, J., Wang, Z. L. Super-Flexible Nanogenerator for Energy Harvesting from Gentle Wind and as an Active Deformation Sensor. Advanced Functional Materials. 2012, 23, 2445-2449.
Zhu, G., Wang, A.C., Liu, Y., Zhou, Y., Wang, Z. L. Functional electrical stimulation by nanogenerator with 58 V output voltage. Nano Letters. 2012, 12, 3086-3090.
Liu, C., Hu, S., Shen, S. Effect of flexoelectricity on electrostatic potential in a bent piezoelectric nanowire. Smart Materials and Structures. 2012, 21, 115024.
Hu, S., Shen, S. Variational principles and governing equations in nanodielectrics with the flexoelectric effect. Science China Physics, Mechanics & Astronomy. 2010, 53 1497-1504.

(56) References Cited

OTHER PUBLICATIONS

R. D. Mindlin. Polarization Gradient in Elastic Dielectrics. International Journal of Solids and Structures. 1968, 4, 637-642.
Zubko, P., Catalan, G., Tagantsev, A.K. Flexoelectric Effect in Solids. Annual Reviews of Materials Research. 2013, 43, 387-421.
Yu, H., Zhou, J., Deng, L., Wen, Z. A Vibration-Based MEMS Piezoelectric Energy Harvester and Power Conditioning Circuit. Sensors. 2014, 14, 3323-3341.
Tang, G., Yang, B., Hou, C., Li, G., Liu, J., Chen, X., Yang, C. A piezoelectric micro generator worked at low frequency and high acceleration based on PZT and phosphor bronze bonding. Scientific Reports. 2016, 6, 38798.
Shen, D., Park, J.H., Noh, J.H., Choe, S.Y., Kim, S.H., Wikle, H.C., Kim, D.J. Micromachined PZT cantilever based on SOI structure for low frequency vibration energy harvesting. Sensors and Actuators A: Physical. 2009, 154, 103-108.
Roundy, S., Wright, P. K. & Rabaey, J. A study of low level vibrations as a power source for wireless sensor nodes. Journal Computer Communication. 2003, 26, 1131-1144.
Houa, T., Yanga, Y., Zhanga, H., Chena, J., Chen, L.J., Wang, Z.L. Triboelectric nanogenerator built inside shoe insole for harvesting walking energy. Nano Energy. 2013, 2, 856-862.
Liu, G., Mrad, N., Abdel-Rahman, E., Ban, D. Cascade-type hybrid energy cells for driving wireless sensors. Nano Energy. 2016, 26, 641-647.
Chen, X., Han, M., Chen, H., Cheng, X., Song, Y., Su, Z., Jiang, Y., Zhang, H. A wave-shaped hybrid piezoelectric and triboelectric nanogenerator based on P(VDF-TrFE) nanofibers. Nanoscale. 2017, 9, 1263-1270.
Jung, W.S., Kang, M.G., Moon, H.G., Baek, S.H., Yoon, S.J., Wang, Z.L., Kim, S.W., Kang, C.Y. High Output Piezo/Triboelectric Hybrid Generator. Scientific Reports. 2015. 5, 9309.
Lee, E.J., Kim, Y.Y., Kim, S.W., Jeong, S., Choi, Y., Lee, S.Y. High-performance piezoelectric nanogenerators based on chemically-reinforced composites. Energy & Environmental Science. 2018, 11, 1425.
Communication pursuant to Rule 69 EPC dated Dec. 16, 2019, from European Patent Application No. 19178284.6, 8 sheets.
Communication pursuant to Article 94(3) EPC dated Feb. 9, 2021, from European Patent Application No. 19178284.6, 8 sheets.
Brijesh Kumar et al: "Controlled Growth of Semiconducting Nanowire, Nanowall, and Hybrid Nanostructures on Graphene for Peizoelectric Nanogenerators", ACS Nano, vol. 5, No. 5, May 24, 2011 (May 24, 2011), pp. 4197-4204, XP055633095, US ISSN: 1936-0851, DOI: 10.1021/nn200942s, *the whole document*, 2 sheets.
Zong-Hong Lin et al: "Enhanced Triboelectric Nanogenerators and Triboelectric Nanosensor Using Chemically Modified $TiO_2$ Nanomaterials", ACS Nano, vol. 7, No. 5, Apr. 23, 2013 (Apr. 23, 2013), pp. 4554-4560, XP055633096, US ISSN: 1936-0851, DOI: 10.1021/nn401256w, *the whole document*, 7 sheets.
Alam Mahmud et al: "Integration of organic/ inorganic nanostructured materials in a hybrid nanogenerator enables efficacious energy harvesting via mutual performance enhancement", Nano Energy, vol. 58, Jan. 11, 2019 (Jan. 11, 2019), pp. 112-120, XP055633099, ISSN: 2211-2855, DOI: 10.1016/j.nanoen.2019.01.023, *the whole document*, 9 sheets.
Alam Mahmud et al: "A High Performance and Consolidated Piezoelectric Energy Harvester Based on 1D/2D Hybrid Zinc Oxide Nanostructures", Advanced Materials Interfaces, vol. 5, No. 23, Oct. 16, 2018 (Oct. 16, 2018), p. 1801167, XP055633097, DE, ISSN: 2196-7350, DOI: 10.1002/admi.201801167, *the whole document*, 8 sheets.
Cheng J P et al: "Oriented growth of ZnO nanostructures on Si and Al substrates", Surface and Coatings Technology, Elsevier BV, Amsterdam, vol. 202, No. 19, Jun. 25, 2008 (Jun. 25, 2008), pp. 4681-4686, XP022708422, ISSN: 0257-8972, DOI: 10.1016/J.SURFCOAT.2008.03.032 [retrieved on Apr. 4, 2008], *the whole document*, 6 sheets.

\* cited by examiner

Completed
Packaged Device
(1cm*1cm)

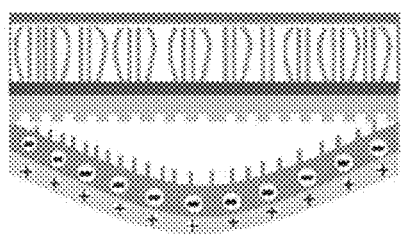
FIG. 10a Released
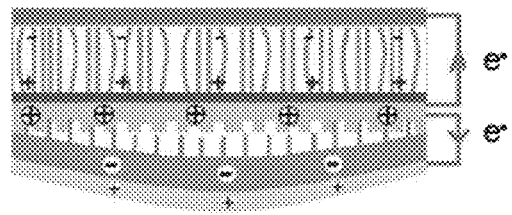
FIG. 10b Pressing
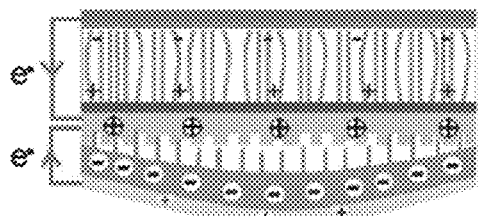
FIG. 10d Releasing
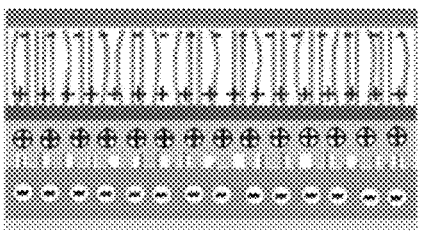
FIG. 10c Fully pressed
Copper · PTFE · Shim · AZO · ZnO nanostructures covered with PMMA · Aluminium

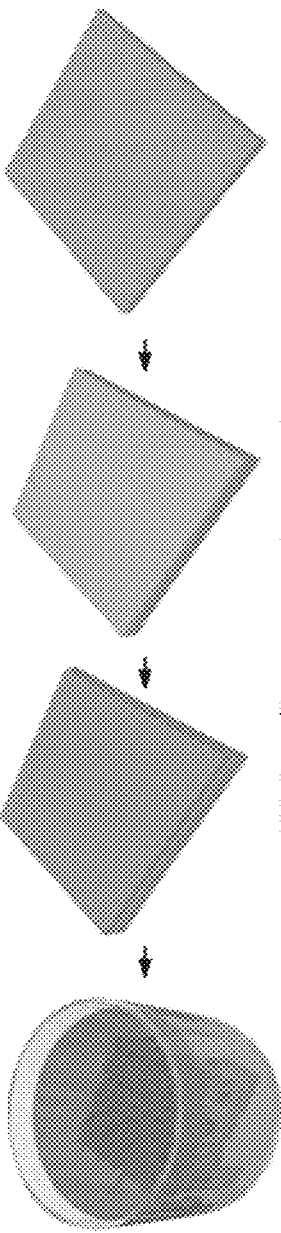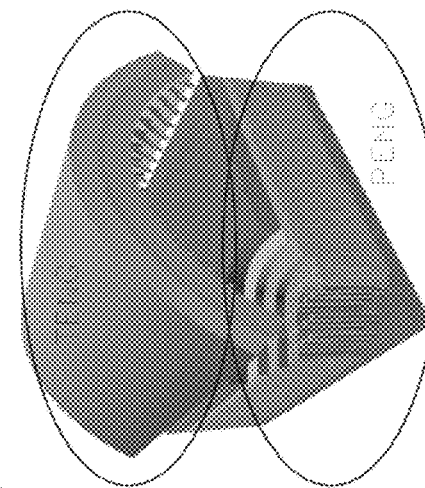
FIG. 11a — Shim Substrate
FIG. 11b — Chromium Deposition (Sputtering)
FIG. 11c — AZO Deposition (PECVD)
FIG. 11d — Hydrothermal Growth
FIG. 11e — PMMA Cover (Spin Coating)
FIG. 11f — Aluminium Deposition (Sputtering)
FIG. 11g — PENG
FIG. 11h — PTFE
FIG. 11i — RIE etching
FIG. 11j — Copper Deposition
FIG. 11k — PET integration
FIG. 11l — Completed Hybrid Device

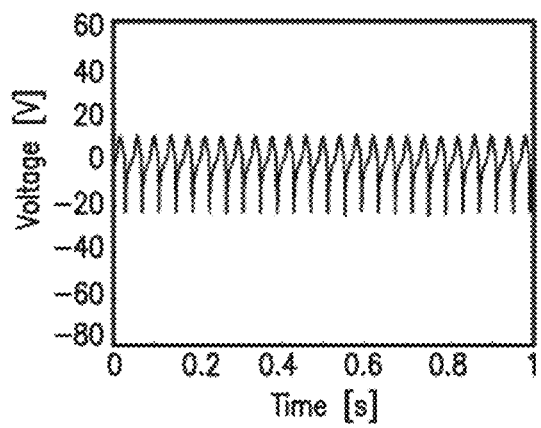 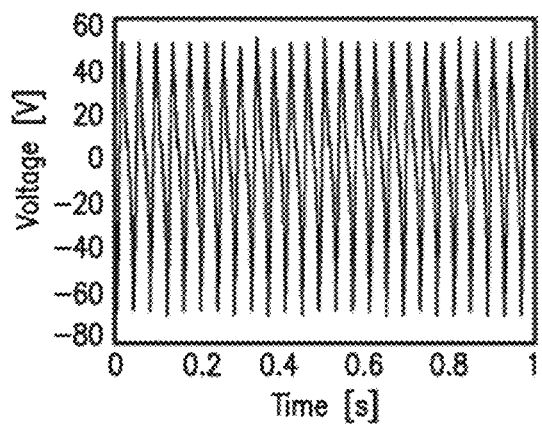
FIG. 15a  FIG. 15b
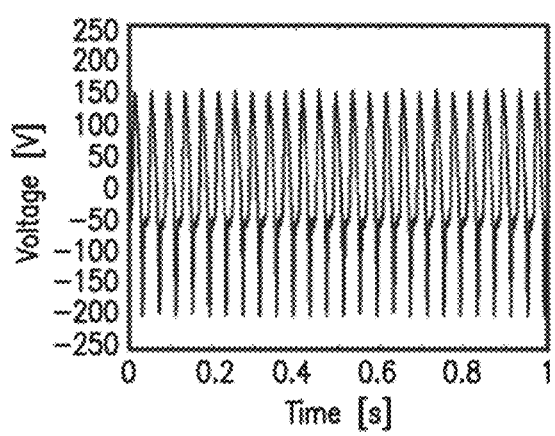 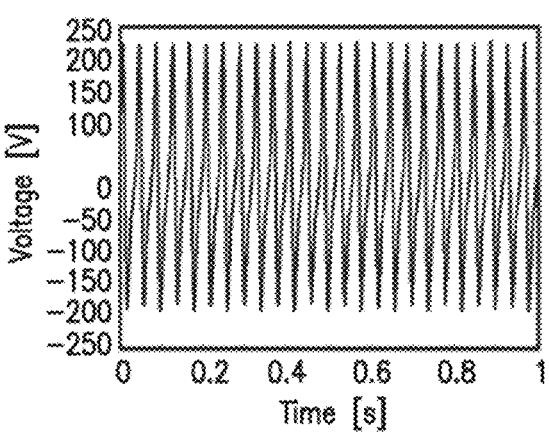
FIG. 15c  FIG. 15d

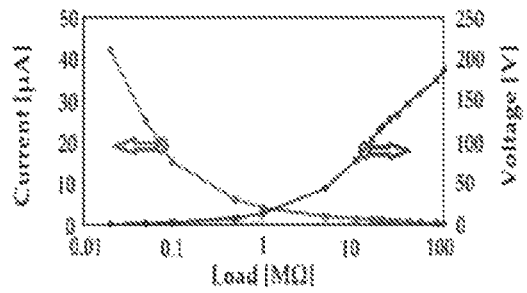 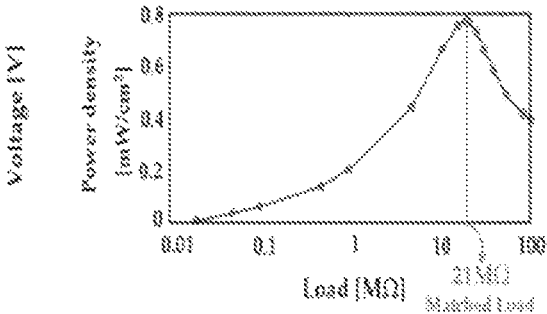
FIG. 17a FIG. 17b
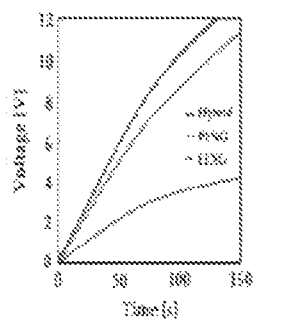 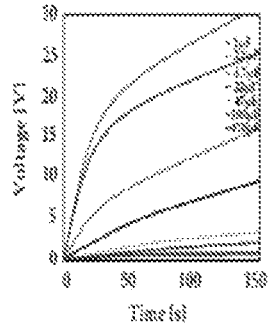 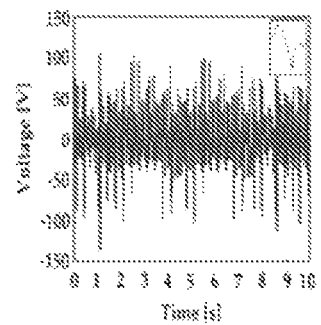 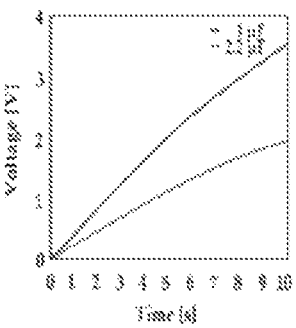
FIG. 17c FIG. 17d FIG. 17e FIG. 17f
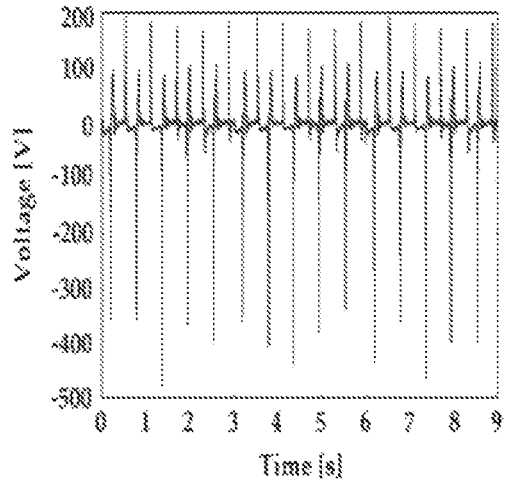
FIG. 17g

1D/2D HYBRID PIEZOELECTRIC NANOGENERATOR AND METHOD FOR MAKING SAME

CROSS-REFERENCE TO RELATED APPLICATION

The present application claims the benefit under 35 U.S.C. § 119(e) of provisional application Ser. No. 62/763,096, filed Jun. 4, 2018 and of provisional application Ser. No. 62/917,121, filed Nov. 21, 2018, the contents of which are hereby incorporated by reference.

BACKGROUND OF THE INVENTION

Field of the Invention

In one of its aspects, the present invention relates to a piezoelectric nanogenerator, and more particularly a piezoelectric nanogenerator comprising a one-dimensional (1D) nanostructure and a two-dimensional (2D) nanostructure integrated on a substrate. The device may be used in, for example, aerospace applications such as aircraft, space vehicles, and the like. It may also be used in self-powered wireless devices such as wearable electronic devices, medical diagnostic devices, implantable devices, and the like.

DESCRIPTION OF THE PRIOR ART

An aircraft structural health monitoring (SHM) system is designed to identify the "state" of the constituent materials of the different parts and of the full assembly of these parts constituting the aircraft structure, which is based on the observation of the system over time using periodically sampled dynamic response measurements from an array of sensors [1-3].

Currently, to perform tasks such as sensing, signal conditioning and processing, data storage, and communication, supplying power to those sensors by means of a battery is the only viable option. As piezoelectric energy harvesting has emerged as an attractive alternative method [4-8], it may be possibly for a piezoelectric energy harvesting mechanism to be attached to a vibrating mechanical source, such as an airframe, wing, or engine, to collect the vibration energy and use that energy to power the sensor arrays in the aircraft SHM system thus eliminating the requirement for an external power source and making the system fully wireless and self-sustaining.

Nanotechnology is at the forefront of emerging technologies to create, visualize, analyse, and manipulate nanostructures, as well as to probe their nano chemistry, nano mechanics, and other properties within the systems [9-11]. Nanotechnology not only provides a means of miniaturizing systems by replacing bulk materials with advanced nanostructures but also provides a means to better understand the physics and chemistry at atomic levels.

Due to the vast reduction in the size and power consumption of sensors and complementary metal oxide semiconductor (CMOS) circuitry over last few decades [12], the field of ambient energy harvesting has emerged with an aim to realize self-powered wireless systems and networks.

Mechanical energy is a large source of wasted energy in modern civilization. As a result, conscientious and advanced research has focused on converting mechanical energy into electricity in order to power electrical devices directly, collect energy for intermittent higher power devices, and/or store energy for later use.

Researchers and scientists have adopted nanotechnology as a powerful tool in this area of harvesting ambient tiny mechanical energy by using different kinds of 1D and 2D nanostructures [13-14].

The use of 1D nanostructures for piezoelectric energy harvesting has been reported [15-16]. Many of the piezoelectric nanogenerators (PENGs) reported to date have been based on 1D zinc oxide (ZnO) nanostructures (e.g. nanowires, nanorods) due to their high electro-mechanical coupling behavior. However, 1D ZnO nanostructures can suffer from mechanically instability.

Piezoelectric power generators based on 2D ZnO nanostructures have also been reported. Due to their buckling behavior and formation of a self-formed anionic nanoclay layer, 2D ZnO nanostructures can generate direct current (DC) type piezoelectric output. 2D ZnO nanostructures can also avoid the mechanical instability of 1D ZnO nanostructures [17-18, 28]. However, the electro-coupling behaviour of 2D ZnO nanostructures is often lower than that seen with 1D ZnO nanostructures.

Despite the advances made to date in the development of piezoelectric nanogenerators, there is room for improvement to address the above-mentioned problems and shortcomings of the prior art.

SUMMARY OF THE INVENTION

It is an object of the present invention to obviate or mitigate at least one of the above-mentioned disadvantages of the prior art.

It is another object of the present invention to provide a novel piezoelectric nanogenerator.

Accordingly, in one of its aspects, the present invention provides a piezoelectric nanogenerator comprising a laminate structure having the following elements: (a) a substrate; (b) a first electrode element; (c) a 1D nanostructure; (d) a 2D nanostructure; and (e) a second electrode element; wherein the 1D nanostructure and the 2D nanostructure are integrated together to form a composite nanostructure; and wherein the composite nanostructure is in electrical contact with both the first electrode element and the second electrode element.

In another of its aspects, the present invention provides a piezoelectric nanogenerator comprising: a substrate; a first electrode element; a second electrode element; and a composite nanostructure interposed between and in electrical contact with the first and second electrode elements, wherein the composite nanostructure comprises a 1D nanostructure integrated with a 2D nanostructure.

In another of its aspects, the present invention provides a process for producing a piezoelectric nanogenerator, wherein the process comprises a hydrothermal method comprising the steps: (a) providing an aqueous solution, the aqueous solution comprising a mixture of zinc nitrate hexahydrate, hexamethylenetetramine, and aluminum nitrate nonahydrate; (b) adding a doping agent to the solution; (c) maintaining the aqueous solution at a substantially constant temperature to configure the height of at least one 1D nanostructure to a pre-selected height; and (d) providing a lateral growth triggering agent in the solution to trigger the growth of at least one 2D nanostructure.

Thus, the present inventors have developed a piezoelectric nanogenerator that comprises 1D and 2D nanostructures integrated together. This composite nanostructure provides enhanced performance in terms of its electrical output as well as mechanical stability, as compared to previously reported piezoelectric nanogenerators that comprise 1D nanostructures or 2D nanostructures alone. With enhanced output performance and mechanical robustness, the present piezoelectric nanogenerator is believed to have application in self-powered devices, such as an aircraft SHM system, wearable electronic devices, medical diagnostic devices, and implantable devices. The present inventors have also developed a simple, low cost, low energy method of synthesizing the present piezoelectric nanogenerator.

When the present piezoelectric nanogenerator is combined with a triboelectric nanogenerator, the resulting hybrid piezoelectric-triboelectric nanogenerator can harvest and convert mechanical energy into electrical energy in a single press-and-release cycle with enhanced output power density and higher energy conversion efficiency as compared to its piezoelectric and triboelectric components on their own. With its enhanced output and fast charging capabilities, together with its long-term stability and robustness, the present hybrid device is believed to have application in the field of self-powered systems and sensor networks.

To the knowledge of the inventors, a piezoelectric nanogenerator and a hybrid piezoelectric-triboelectric nanogenerator having such a combination of features are heretofore unknown.

Other advantages of the invention will become apparent to those of skill in the art upon reviewing the present specification.

BRIEF DESCRIPTION OF THE DRAWINGS

Embodiments of the present invention will be described with reference to the accompanying drawings, wherein like reference numerals denote like parts, and in which:

FIG. 2a and FIG. 2b illustrate perspective (45° tilted) view SEM images of the nanostructures, showing the average diameter of the 1D ZnO nanostructures is about 70 nm and the thickness of 2D ZnO nanostructures is about 50 nm. FIG. 2c illustrates a side, cross-section view SEM image of the ZnO nanostructures, showing an average height of 1.3 µm.

FIGS. 10a to 10d are cross-section schematics of a working mechanism of the hybrid device illustrated in FIG. 9a in a single press-and-release cycle of applied mechanical vibration.

FIGS. 11a to 11l illustrates perspective and cross-section views illustrating a fabrication process of the hybrid device illustrated in FIG. 9a. Steps (a)-(g), shown in FIGS. 11a-11g, illustrate the fabrication steps for the piezoelectric component and steps (h)-(k), shown in FIGS. 11h-11k, illustrate the fabrication steps for the triboelectric component. Step (l), shown in FIG. 11l, illustrates the integration of piezoelectric and triboelectric components into the hybrid nanogenerator device.

FIGS. 12a-12d illustrate a materials characterization of the hybrid device illustrated in FIG. 9a. FIG. 12a is a perspective view AFM image of shim substrate. Top view SEM images of (b) the nanostructured shim surface (shown in FIG. 12b), (c) as grown ZnO NWs along with nano plate structures (shown in FIG. 12c), and (d) PTFE nanostructures (shown in FIG. 12d), are also illustrated.

FIGS. 14a to 14d illustrate preliminary experimental data of the hybrid device illustrated in FIG. 9a. FIG. 14a illustrates a concurrent measurement method for piezoelectric and triboelectric outputs. FIG. 14b illustrates the piezoelectric and triboelectric outputs combined in parallel for the hybrid output measurement. Using the rectifier circuits, measured piezoelectric, triboelectric, and hybrid output open-circuit voltages are illustrated in FIG. 14c and short-circuit currents are illustrated in FIG. 14d.

FIGS. 15a to 15d illustrate the voltage output of the piezoelectric and triboelectric components of the hybrid device illustrated in FIG. 9a. The following preliminary experimental data is illustrated: (a) $V_{oc}$ of the piezoelectric component when acting alone (shown in FIG. 15a), (b) $V_{oc}$ of the piezoelectric component enhanced by the electrostatic induced charge on the shim substrate (shown in FIG. 15b), (c) $V_{oc}$ of the triboelectric component when acting alone (shown in FIG. 15c), and (d) $V_{oc}$ of the triboelectric component enhanced by the piezoelectric induced charge on the common electrode (shown in FIG. 15d).

FIGS. 17a to 17g illustrate preliminary experimental electrical characterization data of the embodiment of the hybrid device illustrated in FIG. 9a. The following data is illustrated: FIG. 17a output voltages and currents for different loads varying from 20Ω to 105 MΩ, FIG. 17b output power as a function of load resistance, FIG. 17c charging characteristic of the device with a 4.7 μF capacitor, FIG. 17d fast charging behavior of the device with different capacitors, FIG. 17e to FIG. 17f output voltage signal and charging behavior of the device with normal human movements, and FIG. 17g collected output signal by the harvester from human walking.

DETAILED DESCRIPTION OF THE PREFERRED EMBODIMENTS

Figure 1A:
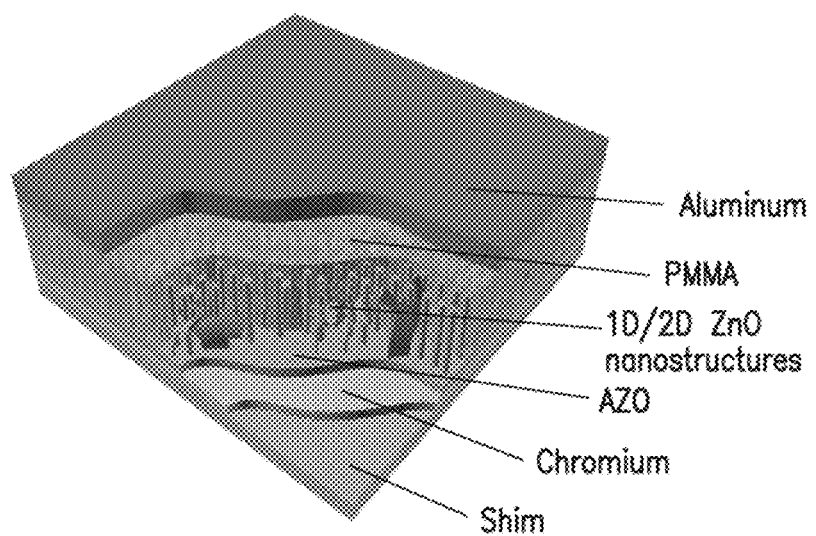
FIG. 1(a) illustrates a perspective view of a 3D schematic diagram of a preferred embodiment of the present piezoelectric nanogenerator.

The present invention relates to a piezoelectric nanogenerator, wherein the piezoelectric nanogenerator comprises a laminate structure having the following elements: (a) a substrate; (b) a first electrode element; (c) a 1D nanostructure; (d) a 2D nanostructure; and (e) a second electrode element; wherein the 1D nanostructure and the 2D nanostructure are integrated together to form a composite nanostructure; and wherein the composite nanostructure is in electrical contact with both the first electrode element and the second electrode element.

Preferred embodiments of this piezoelectric nanogenerator may include any one of or a combination of any two or more of any of the following features:
- the substrate comprises a polymer;
- the substrate comprises a non-polymeric material;
- the substrate comprises an alloy;
- the substrate comprises a flexible material;
- the substrate comprises a rigid material;
- the alloy comprises aluminum;
- the alloy comprises aluminum, zinc, manganese, silicon, and iron;
- the substrate is coated with a catalyst layer comprising metal;
- the catalyst layer is coated on the substrate using magnetron sputtering;
- the catalyst layer comprises chromium;
- the piezoelectric nanogenerator further comprises a seed layer;
- the seed layer comprises zinc oxide layer;
- the seed layer comprises aluminum-doped zinc oxide;
- the seed layer has a thickness of about 100 nm to about 700 nm;
- the seed layer has a thickness of about 200 nm;
- the seed layer has a thickness of about 400 nm;
- the seed layer is deposited on top of the substrate by plasma-enhanced chemical vapor deposition;
- the plasma-enhanced chemical vapor deposition is conducted at about 250° C.;
- the substrate and the first electrode element are integral;
- the substrate and the first electrode element are separate;
- the first electrode element comprises an optically-transparent first electrode;
- the first electrode element comprises a layer of aluminum-doped zinc oxide;
- the first electrode element comprises a layer of indium tin oxide;
- the first electrode element has a thickness of up to 15 μm;
- the 1D nanostructure comprises a single nanostructure;
- the 1D nanostructure comprises nanowires;
- the 1D nanostructure comprises nanorods;
- the 1D nanostructure comprises more than one nanostructure;
- the 1D nanostructure comprises nanowires and nanorods;
- the 1D nanostructure comprises zinc oxide;
- the 1D nanostructure comprises intrinsic zinc oxide nanostructures;
- the 1D nanostructure comprises p-n junction type zinc oxide nanostructures;
- the 2D nanostructure comprises a single 2D nanostructure;
- the 2D nanostructure comprises more than one 2D nanostructure;
- the 2D nanostructure comprises nanosheets;
- the 1D and 2D nanostructures are co-mingled;
- the 2D nanostructure comprises zinc oxide;
- the piezoelectric nanogenerator further comprises an insulating buffer layer;
- the buffer layer comprises a non-polymeric material;
- the buffer layer comprises a polymer;
- the buffer layer comprises a poly-methyl methacrylate (PMMA);
- the buffer layer comprises 2% poly-methyl methacrylate (PMMA);
- the buffer layer at least partially covers the composite nanostructures;
- the buffer layer completely encases the composite nanostructures;
- the buffer layer is spin coated onto the composite nanostructures;
- the buffer layer is spin coated onto the composite nanostructures and then cured at a temperature of about 120° C. for at least three (3) hours;
- the second electrode element comprises an optically-transparent second electrode;
- the second electrode element comprises a layer of indium tin oxide;
- the second electrode element comprises aluminum;
- the second electrode element has a thickness of about 50 nm to about 500 nm;
- the second electrode element has a thickness of about 100 nm;
- the second electrode element is deposited on the surface of the buffer layer using magnetron sputtering;

the 1D nanostructure and the 2D nanostructure are grown on the substrate using a hydrothermal method;
the 1D nanostructure and the 2D nanostructure are grown on the substrate using a hydrothermal method;
the hydrothermal method comprises the steps:
  providing an aqueous solution, the aqueous solution comprising a mixture of zinc nitrate hexahydrate, hexamethylenetetramine, and aluminum nitrate nonahydrate;
  adding a doping agent to the solution;
  maintaining the aqueous solution at a substantially constant temperature to configure the height of the 1D nanostructure to a pre-selected height; and
  providing a lateral growth triggering agent in the solution to trigger the growth of the 2D nanostructure;
a hybrid nanogenerator device comprising:
  the claimed piezoelectric nanogenerator; and
  a triboelectric nanogenerator,
wherein the piezoelectric nanogenerator and the triboelectric nanogenerator are integrated;
wherein the triboelectric nanogenerator comprises:
  a triboelectric layer having a contacting side and an opposite backing side, the triboelectric layer comprising a material that has a first position on a triboelectric series; and
  an electrode layer disposed along the backing side of the dielectric layer;
wherein the dielectric layer is configured such that it is spaced apart from the first electrode element and is configured to contact the first electrode element when a compressive force is applied to the hybrid nanogenerator device, the first electrode comprising a material that has a second position on the triboelectric series that is different from the first position of the triboelectric layer;
the triboelectric nanogenerator further comprises a mechanical support layer, the mechanical support layer being secured to the electrode layer opposite to the triboelectric layer;
the mechanical support layer causes the triboelectric nanogenerator to have an arched, concave shape;
the first electrode element comes into contact with the triboelectric layer on a top surface, the first electrode top surface comprising nanostructures;
the nanostructures are applied to the first electrode top surface using a hot deionized water treatment;
the triboelectric layer comprises nanostructures on the contacting side;
the nanostructures are applied to the contacting side of the triboelectric layer using reactive ion etching;
the triboelectric layer comprises a dielectric material;
the triboelectric layer comprises polytetrafluoroethylene (PTFE);
the PTFE has a thickness of about 10 µm to about 200 µm;
the PTFE has a thickness of about 50 µm;
the electrode layer comprises a metal with good electrical conductivity;
the electrode layer comprises copper;
the copper is deposited on the first surface of the triboelectric material using electron beam evaporation;
the mechanical support layer comprises polyethylene terephthalate (PET);
the mechanical support layer is secured to the electrode layer with double-sided copper tape;
a layer of gold is deposited on the contact surface of the PTFE;
the gold layer is deposited on the triboelectric layer using electron beam evaporation;
the gold layer has a thickness of about 5 nm to about 15 nm;
the gold layer has a thickness of about 10 nm;
an aircraft structural health monitoring system incorporating the claimed piezoelectric nanogenerator;
a self-powered device incorporating the claimed piezoelectric nanogenerator; and/or
the self-powered device incorporating the claimed piezoelectric nanogenerator is a wearable electronic device, a medical diagnostic device, or an implantable device.

The present invention also relates to a piezoelectric nanogenerator, wherein the piezoelectric nanogenerator comprises: a substrate; a first electrode element; a second electrode element; and a composite nanostructure interposed between and in electrical contact with the first and second electrode elements, wherein the composite nanostructure comprises a 1D nanostructure integrated with a 2D nanostructure.

Preferred embodiments of this piezoelectric nanogenerator may include any one of or a combination of any two or more of any of the following features:
the substrate comprises a polymer;
the substrate comprises a non-polymeric material;
the substrate comprises an alloy;
the substrate comprises a flexible material;
the substrate comprises a rigid material;
the alloy comprises aluminum;
the alloy comprises aluminum, zinc, manganese, silicon, and iron;
the substrate is coated with a catalyst layer comprising metal;
the catalyst layer is coated on the substrate using magnetron sputtering;
the catalyst layer comprises chromium;
the piezoelectric nanogenerator further comprises a seed layer;
the seed layer comprises zinc oxide layer;
the seed layer comprises aluminum-doped zinc oxide;
the seed layer has a thickness of about 100 nm to about 700 nm;
the seed layer has a thickness of about 200 nm;
the seed layer has a thickness of about 400 nm;
the seed layer is deposited on top of the substrate by plasma-enhanced chemical vapor deposition;
the plasma-enhanced chemical vapor deposition is conducted at about 250° C.;
the substrate and the first electrode element are integral;
the substrate and the first electrode element are separate;
the first electrode element comprises an optically-transparent first electrode;
the first electrode element comprises a layer of aluminum-doped zinc oxide;
the first electrode element comprises a layer of indium tin oxide;
the first electrode element has a thickness of up to 15 µm;
the 1D nanostructure comprises a single nanostructure;
the 1D nanostructure comprises nanowires;
the 1D nanostructure comprises nanorods;
the 1D nanostructure comprises more than one nanostructure;
the 1D nanostructure comprises nanowires and nanorods;
the 1D nanostructure comprises zinc oxide;
the 1D nanostructure comprises intrinsic zinc oxide nanostructures;

the 1D nanostructure comprises p-n junction type zinc oxide nanostructures;
the 2D nanostructure comprises a single 2D nanostructure;
the 2D nanostructure comprises more than one 2D nanostructure;
the 2D nanostructure comprises nanosheets;
the 1D and 2D nanostructures are co-mingled;
the 2D nanostructure comprises zinc oxide;
the piezoelectric nanogenerator further comprises an insulating buffer layer;
the buffer layer comprises a non-polymeric material;
the buffer layer comprises a polymer;
the buffer layer comprises a poly-methyl methacrylate (PMMA);
the buffer layer comprises 2% poly-methyl methacrylate (PMMA);
the buffer layer at least partially covers the composite nanostructures;
the buffer layer completely encases the composite nanostructures;
the buffer layer is spin coated onto the composite nanostructures;
the buffer layer is spin coated onto the composite nanostructures and then cured at a temperature of about 120° C. for at least three (3) hours;
the second electrode element comprises an optically-transparent second electrode;
the second electrode element comprises a layer of indium tin oxide;
the second electrode element comprises aluminum;
the second electrode element has a thickness of about 50 nm to about 500 nm;
the second electrode element has a thickness of about 100 nm;
the second electrode element is deposited on the surface of the buffer layer using magnetron sputtering;
the 1D nanostructure and the 2D nanostructure are grown on the substrate using a hydrothermal method;
the 1D nanostructure and the 2D nanostructure are grown on the substrate using a hydrothermal method;
the hydrothermal method comprises the steps:
  providing an aqueous solution, the aqueous solution comprising a mixture of zinc nitrate hexahydrate, hexamethylenetetramine, and aluminum nitrate nonahydrate;
  adding a doping agent to the solution;
  maintaining the aqueous solution at a substantially constant temperature to configure the height of the 1D nanostructure to a pre-selected height; and
  providing a lateral growth triggering agent in the solution to trigger the growth of the 2D nanostructure;
a hybrid nanogenerator device comprising:
  the claimed piezoelectric nanogenerator; and
  a triboelectric nanogenerator,
wherein the piezoelectric nanogenerator and the triboelectric nanogenerator are integrated;
wherein the triboelectric nanogenerator comprises:
  a triboelectric layer having a contacting side and an opposite backing side, the triboelectric layer comprising a material that has a first position on a triboelectric series; and
  an electrode layer disposed along the backing side of the dielectric layer;
wherein the dielectric layer is configured such that it is spaced apart from the first electrode element and is configured to contact the first electrode element when a compressive force is applied to the hybrid nanogenerator device, the first electrode comprising a material that has a second position on the triboelectric series that is different from the first position of the triboelectric layer;
the triboelectric nanogenerator further comprises a mechanical support layer, the mechanical support layer being secured to the electrode layer opposite to the triboelectric layer;
the mechanical support layer causes the triboelectric nanogenerator to have an arched, concave shape;
the first electrode element comes into contact with the triboelectric layer on a top surface, the first electrode top surface comprising nanostructures;
the nanostructures are applied to the first electrode top surface using a hot deionized water treatment;
the triboelectric layer comprises nanostructures on the contacting side;
the nanostructures are applied to the contacting side of the triboelectric layer using reactive ion etching;
the triboelectric layer comprises a dielectric material;
the triboelectric layer comprises polytetrafluoroethylene (PTFE);
the PTFE has a thickness of about 10 μm to about 200 μm;
the PTFE has a thickness of about 50 μm;
the electrode layer comprises a metal with good electrical conductivity;
the electrode layer comprises copper;
the copper is deposited on the first surface of the triboelectric material using electron beam evaporation;
the mechanical support layer comprises polyethylene terephthalate (PET);
the mechanical support layer is secured to the electrode layer with double-sided copper tape;
a layer of gold is deposited on the contact surface of the PTFE;
the gold layer is deposited on the triboelectric layer using electron beam evaporation;
the gold layer has a thickness of about 5 nm to about 15 nm;
the gold layer has a thickness of about 10 nm;
an aircraft structural health monitoring system incorporating the claimed piezoelectric nanogenerator;
a self-powered device incorporating the claimed piezoelectric nanogenerator; and/or
the self-powered device incorporating the claimed piezoelectric nanogenerator is a wearable electronic device, a medical diagnostic device, or an implantable device.

The present invention also relates to a process for producing a piezoelectric nanogenerator, wherein the process comprises a hydrothermal method comprising the steps: (a) providing an aqueous solution, the aqueous solution comprising a mixture of zinc nitrate hexahydrate, hexamethylenetetramine, and aluminum nitrate nonahydrate; (b) adding a doping agent to the solution; (c) maintaining the aqueous solution at a substantially constant temperature to configure the height of at least one 1D nanostructure to a pre-selected height; and (d) providing a lateral growth triggering agent in the solution to trigger the growth of at least one 2D nanostructure.

Preferred embodiments of this process may include any one of or a combination of any two or more of any of the following features:
  the aqueous solution comprises a mixture of 25 mM zinc nitrate hexahydrate, 25 mM hexamethylenetetramine, and 25 mM aluminum nitrate nonahydrate;
  the doping agent comprises lithium (Li) nitrate;

the aqueous solution is maintained at about 88° C.;
the height of the at least 1D nanostructure is between about 0.25 μm and about 5 μm;
the height of the at least 1D nanostructure is between about 0.5 μm and 3 μm;
the diameter of the at least 1D nanostructure is between about 40 nm and about 300 nm;
the diameter of the at least 1D nanostructure is between about 50 nm and about 120 nm;
the thickness of the at least one 2D nanostructure is between about 25 nm and about 100 nm;
the thickness of the at least one 2D nanostructure is between about 40 nm and about 75 nm;
the lateral growth triggering agent comprises hydroxide (OH⁻);
the lateral growth triggering agent comprises a metal hydroxide;
the metal is aluminum, tin, lead, beryllium, or copper;
the hydroxide is aluminum hydroxide ($Al(OH)_{4-}$);
metal from the substrate dissolves in the aqueous solution, producing the metal hydroxide; and/or
a piezoelectric nanogenerator produced by the claimed process.

Preferred embodiments of the present invention will be described with reference to the following exemplary information which should not be used to limit or construe the invention.

1. Material Growth and Characterization

Figure 1B:
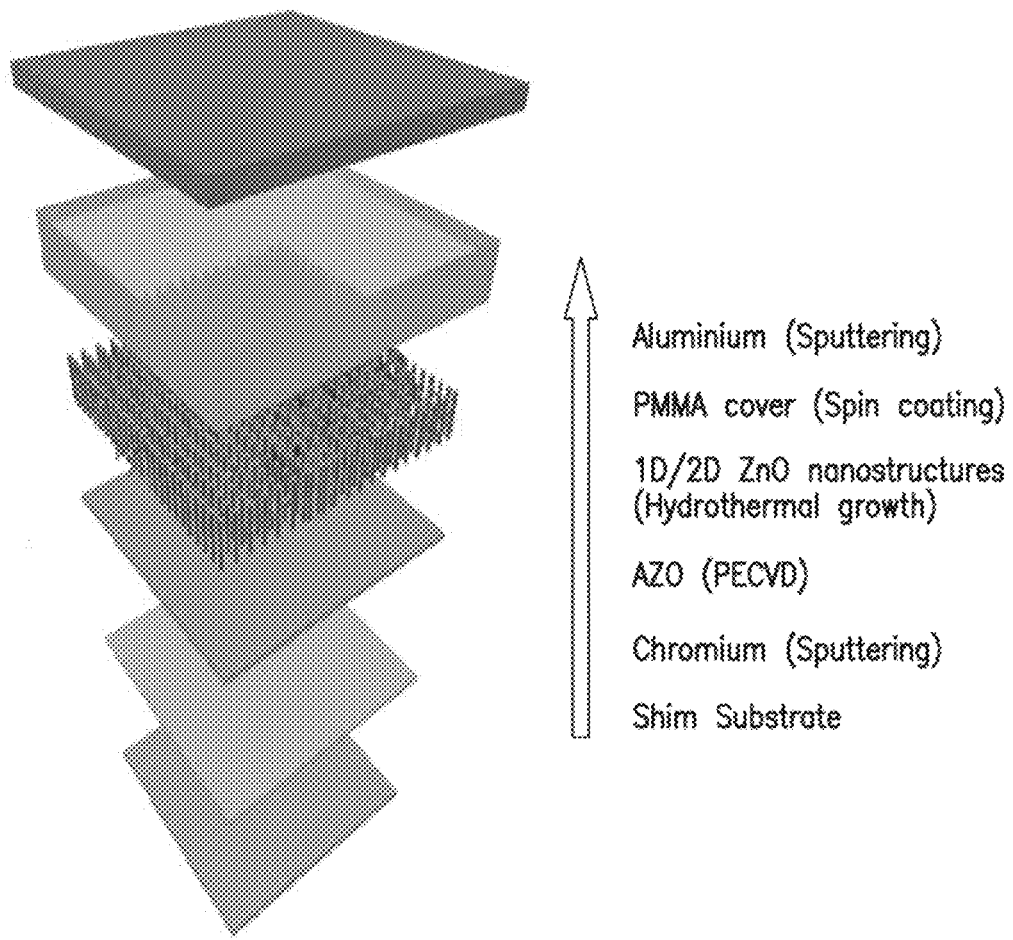
FIG. 1(b) illustrates an exploded view schematic of fabrication steps of the preferred embodiment of the present piezoelectric nanogenerator illustrated in FIG. 1(a).

FIG. 1a illustrates a schematic of an embodiment of the present piezoelectric nanogenerator and FIG. 1b illustrates a schematic of the fabrication steps of same. In the illustrated embodiment, the structure was fabricated on a 1.2×1.2 cm² shim substrate. The shim substrate was an alloy with the following material compositions: aluminium (99.29%), zinc (0.04%), manganese (0.04%), silicon (0.13%), iron (0.48%), other (0.02%).

Firstly, the substrate was cleaned using acetone, isopropyl alcohol (IPA), and deionized (DI) water, respectively. After that a 400 nm aluminium doped zinc oxide (AZO) layer was deposited on the substrate using plasma-enhanced chemical vapor deposition (PECVD) at 250° C. and 5 mT. The AZO layer served as the seed layer for the hydrothermal growth of subsequent ZnO nanostructures, as well as played a role in the growth process. After the hydrothermal growth of ZnO nanostructures as discussed in the following section, the sample was cleaned using standard process. Next, a 2% PMMA solution in acetone was spin coated onto the sample and then cured at a temperature of 120° C. for three (3) hours. Finally, a 100 nm aluminium layer was deposited on top of the PMMA layer as the top electrode using magnetron sputtering. Then two copper wires were connected to the top aluminium and the shim substrate which served as external electrodes for the testing of the device.

1.1 Hydrothermal Growth of ZnO Nanostructures

In the illustrated embodiment, the nanostructures comprised ZnO. To grow ZnO nanostructures, the substrate was attached to a precleaned glass substrate and immersed into a mixture of solutions: zinc nitrate hexahydrate (25 mM), hexamethylenetetramine (HMTA) (25 mM), and aluminium nitrate nonahydrate (25 mM) using a substrate holder in such a way that the AZO deposited layer faced downward in order to avoid the accumulation of any debris on the substrate during the hydrothermal process [20]. The solution was kept at a constant temperature of 88° C. during the hydrothermal growth. It has been found that a constant temperature of 88° C. during the hydrothermal growth can provide conditions for the growth of the desired ZnO nanostructures of the preferred embodiment, instead of growing nanoballs (below 75° C.) or mostly nanorods (above 95° C.) [21].

The height of nanostructures can be controlled by the growth time. In the illustrated embodiment, the growth time of the nanostructures was two (2) hours. HMTA was used to synthesize the ZnO nanostructures by reacting with water to produce ammonia that provided a slow and controlled supply of OH⁻ anions [22]. Due to the lowest surface energy of (002) facet, the wurtzite ZnO crystal grew preferentially along [001] direction and as a result, 1D ZnO nanowires and nanorods were obtained [20].

To trigger lateral growth of the 2D ZnO nanostructures in the illustrated embodiment, $Al(OH)_4^-$ was used. Aluminium (Al) can contribute to the suppression effect along [001] direction, which can lead to the formation of sheet-like morphological ZnO crystals. In this illustrated embodiment, Al from the shim substrate was dissolved into the solution and under the alkaline conditions that originated from HMTA, $Al(OH)_{4-}$ ions were produced, as Al is an amphoteric metal [24]:

$$Al^{3+} + 4OH^- = Al(OH)_4^- \qquad (1)$$

$Al(OH)_4^{-4}$ was then bound to the $Zn^{2+}$ terminated (001) surface and suppressed growth of nanostructures along [001] direction which eventually triggered lateral growth to form 2D ZnO nanostructures [25-26].

1.2 Characterization of the Nanostructures

Due to the potential influence of several process parameters in the hydrothermal approach to grow ZnO nanostructures such as temperature, seed layer type and thickness, concentration of precursor solutions, and growth time, the process described herein can be modified to synthesize the desired nanostructures by taking into account these parameters.

The term "1D nanostructure" used herein can refer to, but is not limited to, nanowires, nanorods, nanofibres, nanotubes, nanoribbons, and nanobelts. The diameter of the 1D nanostructures of the present piezoelectric nanogenerator can be any pre-selected diameter, and is preferably between about 40 nm and about 300 nm, more preferably between about 50 nm and about 120 nm.

The term "2D nanostructure" used herein can refer to, but is not limited to, nanoplates, nanosheets, nanowalls, and nanodisks. The thickness of the 2D nanostructure of the present piezoelectric nanogenerator can be any pre-selected thickness, and is preferably between about 25 nm and about 100 nm, more preferably between about 40 nm and about 75 nm.

The height of the 1D and 2D nanostructures of the present piezoelectric nanogenerator can be any pre-selected height, and is preferably between about 0.25 μm and about 5 μm, more preferably between about 0.5 μm and about 3 μm.

Figure 2A:
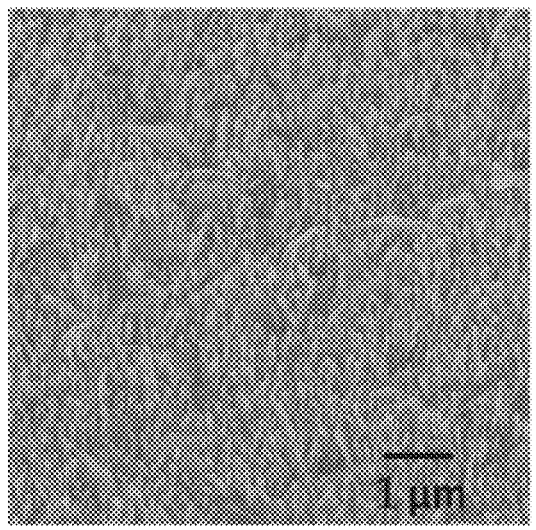
FIGS. 2a to 2c illustrate SEM images of ZnO nanostructures of the preferred embodiment of the piezoelectric nanogenerator illustrated in FIG. 1(a).
Figure 2B:
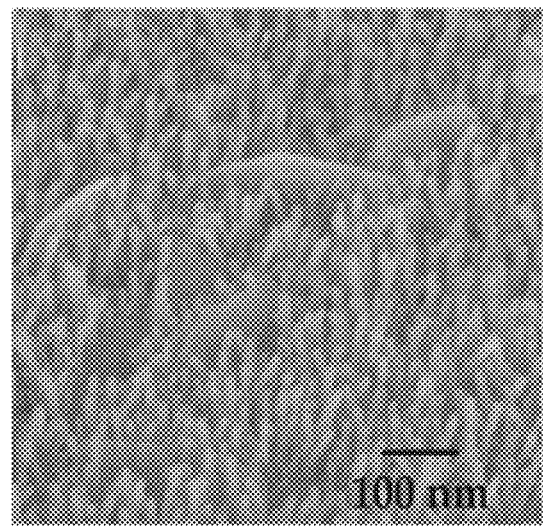
Figure 2C:
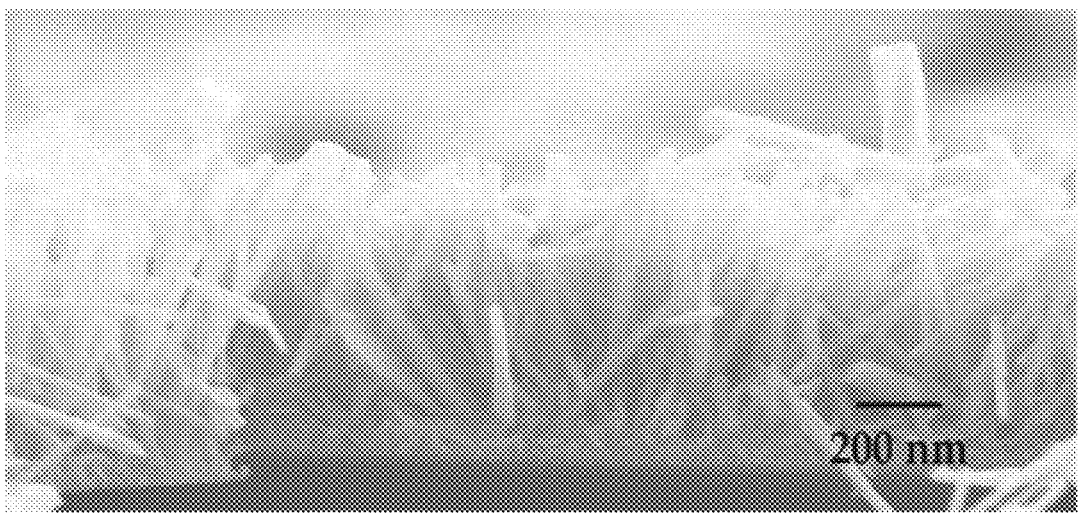

FIGS. 2a and 2b illustrate a 45° tilted view SEM image of as-grown ZnO nanostructures of a preferred embodiment of the present piezoelectric nanogenerator at different scales. FIG. 2c is an SEM image illustrating the cross-section of the nanostructures in the illustrated embodiment.

The term "integrated" as used herein is used to describe the arrangement of 1D and 2D nanostructures. The 1D and 2D nanostructures may be in any arrangement with respect to one another, including but not limited to a laminate arrangement or a co-mingled arrangement. In a preferred embodiment, the 1D and 2D nanostructures are co-mingled.

As illustrated in FIGS. 2a to 2c, the growth of nanostructures in the illustrated embodiment was uniform across a large area. From the magnified image in FIG. 2b, it can be seen that both 1D and 2D ZnO nanostructures were grown on the substrate and in a co-mingled manner.

In the illustrated embodiment, the diameter of the 1D ZnO nanostructures varied between 50 nm to 120 nm, with an average diameter of 70 nm. The 1D ZnO nanostructures were closely packed on the substrate surface due to the thick AZO seed layer, which not only facilitated growth of the 1D nanostructures with higher aspect ratio but also increased the density of the 1D nanostructures [27]. The 2D nanostructures were buckled and had a self-assembled interlaced configuration with a thickness of approximately 50 nm. The nanostructures had an average height of 1.3 μm, as illustrated in FIG. 2c.

2. Piezoelectric Characterization 2.1 Measurement Set-Up

Figure 3A:
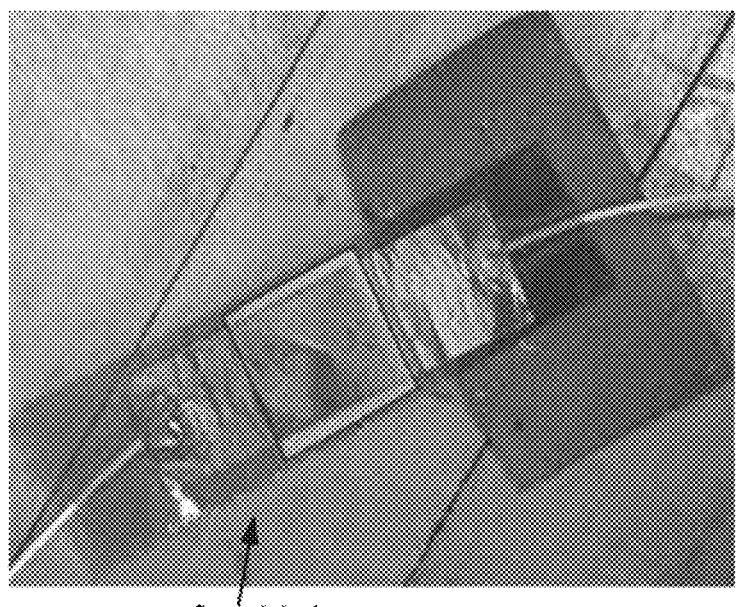
FIG. 3a is a photograph of complete packaged device of the preferred embodiment of the piezoelectric nanogenerator illustrated in FIGS. 1a and 2a-2c, prepared for testing.
Figure 3B:
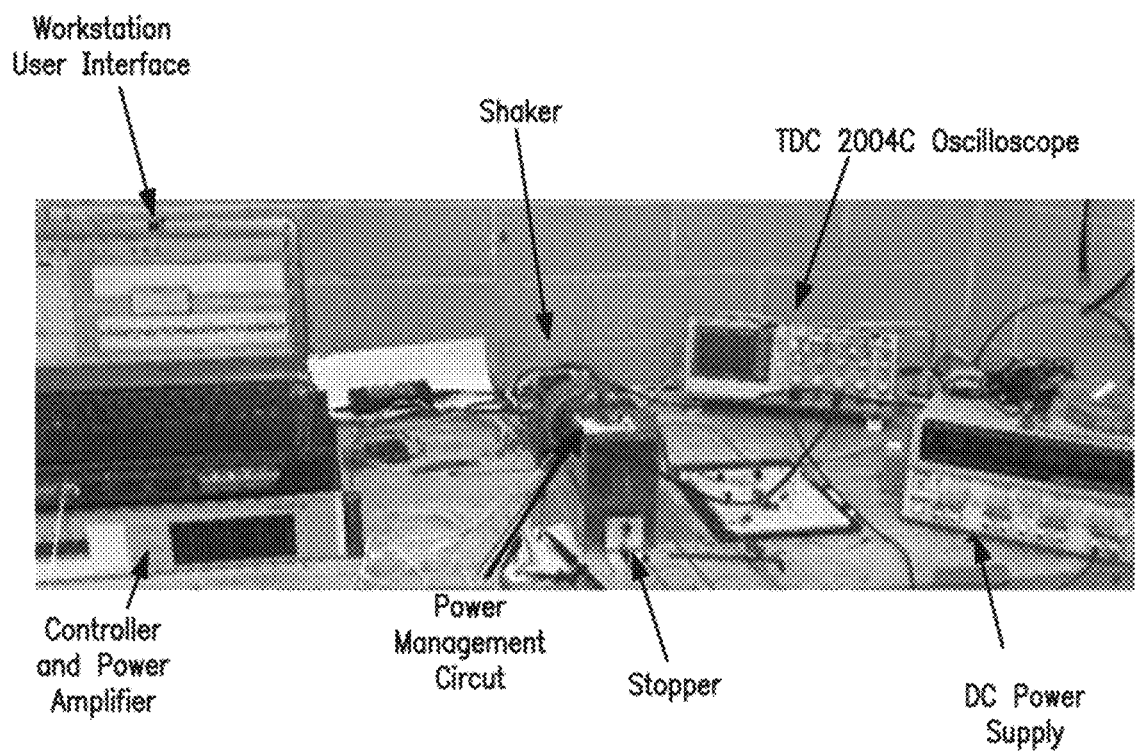
FIG. 3b illustrates a demonstration of a general set-up of a piezoelectric characterization system.

To obtain quantitative information about the piezo response of the illustrated embodiment of the present piezoelectric nanogenerator, the illustrated embodiment was fabricated as set out above, packaged, and then tested using the characterization set up illustrated in FIG. 3b. Testing was conducted for a particular amount of applied vertical strain on top of the device with a particular acceleration and known frequency.

An electromagnetic shaker unit, Labworks Inc.'s ET-126-1, was used to deliver acceleration to a brass rod with a known mass (m=0.45 kg) acting as a hammer which applied the vertical mechanical strain on top of the illustrated piezoelectric nanogenerator mounted on a stopper. The shaker was driven using a Labworks Inc.'s Pa 138 power amplifier. A controller unit, Vibration Research's VR9500 Revolution, was used to control and maintain the desired acceleration amplitude and frequency via closed loop control. Output voltage was measured and stored digitally through a Tektronix TDC2004C oscilloscope. For output current signal acquisition, a low noise current preamplifier, Stanford SR570, was used with an input resistance of 10 kΩ.

2.2 Results and Discussion

Quantitative experimental measurements were conducted to obtain the piezoelectric response from a fabricated preferred embodiment of the present piezoelectric nanogenerator. The energy harvesting mechanism of the present piezoelectric nanogenerator is based on the generation of piezopotential along the c-axis of the nanostructures under compressive strain to drive charge back and forth between the bottom and top electrodes. At the initial state before the hammer strikes the top layer of the piezoelectric nanogenerator, no piezopotential is present. When an external force is applied on the top layer, the tensile side surface gives a positive potential, while a negative potential appears on the compressive side surface and consequently it generates a negative piezopotential (V−) at the p-ZnO/PMMA interface and a positive piezopotential (V+) at the AZO/n-ZnO interface [27].

Owing to this potential difference between the electrodes and the presence of a Schottky barrier formed in the metal-insulator-semiconductor (MIS) junction with Al/PMMA/p-ZnO, electrons flow from the top electrode to the bottom electrode through an external circuit creating a positive current pulse and this continues until the material system reaches an equilibrium which eventually makes the output zero. When the force is released, the piezopotential fades away and the electrons from the bottom electrode flow back to the top electrode to establish an equilibrium and a negative pulse is observed. After the equilibrium is achieved, the piezoelectric nanogenerator returns to its initial state.

Figure 4A:
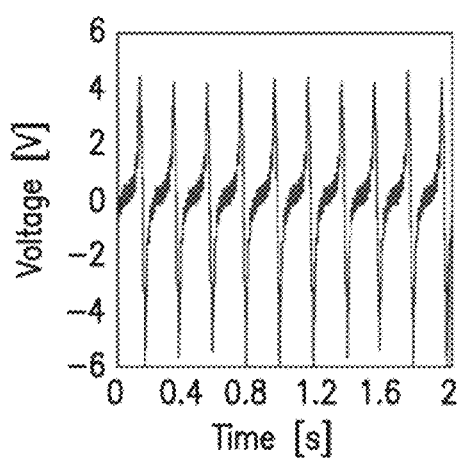
FIGS. 4a and 4b illustrate preliminary experimental results of (a) the measured open-circuit voltage (shown in FIG. 4a) and (b) the short-circuit current (shown in FIG. 4b) of the preferred embodiment of the piezoelectric nanogenerator illustrated in FIGS. 1a and 2a-2c when the peak-to-peak displacement is kept constant at 5 mm.
Figure 4B:
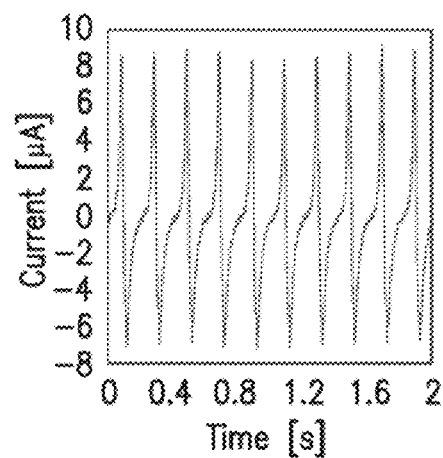

FIGS. 4a and 4b illustrates the open circuit voltage and short circuit current that was obtained from a preferred embodiment of the present piezoelectric nanogenerator when tested under a sinusoidal mechanical force with a frequency of 5 Hz and when the hammer peak-to-peak displacement was kept at 5 mm. The force applied on the piezoelectric nanogenerator was set to be 5 N for all measurements by using a force sensor. Under the above condition, the piezoelectric nanogenerator produced peak to peak open circuit voltage of ~10.18 V and short circuit current of ~15.9 μA. The piezoelectric nanogenerator produced peak output voltage of ~4.2 V, average current density of ~6.08 μA/cm$^2$ (average current was 8.75 μA and device area was 1.44 cm$^2$), and average power density of ~25.536 μW/cm$^2$.

The present piezoelectric nanogenerator provides enhanced electrical output as well as mechanical stability as compared to previously reported piezoelectric nanogenerators that comprise 1D nanostructures [8,13,42] or 2D nanostructures alone [17-18, 28]. While not wishing to be bound by any particular theory or mode of action, the enhanced output of the present piezoelectric nanogenerator may be attributed, at least in part, to the factors discussed below.

Firstly, as the 1D/2D nanostructures of the present invention are grown together, the buckling behaviour of the 2D nanostructures contributes to the piezopotential, which comes from the piezoelectric behaviour of the 2D nanostructures as a positive potential at the stretched side of the 2D nanostructures and a negative potential at the compressed side of the 2D nanostructures [28]. The 2D nanostructures not only act as a piezoelectric material but also suppress the piezoelectric "charge screening effect", which can have a detrimental effect for PENGs, by means of making walls amongst the 1D nanostructures. It has been reported that the strain-energy density of 2D ZnO nanostructures is about ten times higher than that of 1D ZnO nanostructures and unlike 1D ZnO nanostructures, 2D ZnO nanostructures can sustain mechanical forces above critical load [28]. As the present piezoelectric nanogenerator is based on the integration of 1D/2D ZnO nanostructures, it may therefore have enhanced robustness in terms of load handling.

Secondly, a preferred embodiment of the invention uses p-n junction type 1D nanostructures, which are grown by adding a doping reagent (LiNO3) during the second half of the hydrothermal growth process. The p-n junction prevents the piezo-induced charges from being screened out within a 1D nanostructure, which improves the local charge screening effect and consequently may enhance the overall output [29-30].

Thirdly, after the growth of the nanostructures in the present invention, the nanostructures are covered with a PMMA layer. This not only provides a polymer matrix to protect the nanostructures against damage during operation of the piezoelectric nanogenerator, hence making the piezoelectric nanogenerator more robust [31], it also forms a MIS junction to build up a Schottky barrier. As the electron affinity of ZnO (4.3 eV) and work function of aluminium (4.26 eV) is not enough to make a Schottky barrier, PMMA having a higher work function (5 eV), is inserted between them to form a Schottky barrier, which is crucial for the operation of a PENG [27]. Furthermore, due to its flexibility, PMMA does not interfere with the external mechanical strain applied to the nanostructure and it also prevents electrical shortage between the top and bottom electrodes of the piezoelectric nanogenerator [32].

Finally, other effects such as flexoelectricity [33-34], polarization gradient [35], and surface effect [34] may contribute to the enhancement of performance of the present piezoelectric nanogenerator. Flexoelectricity is a property of a dielectric material that causes polarization due to non-uniform strain in the material. When a dielectric material experiences mechanical stress, its electric polarization ($p_i$) can expressed by Equation 2 [36]:

$$p_i = d_{ijk}\sigma_{jk} + \mu_{ijkl}\delta\varepsilon_{jk}/\delta x, \quad (2)$$

where $d_{ijk}$ corresponds to direct piezoelectric effect, $\mu_{ijkl}$ is a fourth-rank polar tensor corresponding to flexoelectric effect, and $\sigma_{jk}$ and $\varepsilon_{jk}$ are second-order Cartesian stress and permittivity tensor, respectively. Although under the classical piezoelectric theory, the flexoelectric effect is not considered, it can play a significant role for nano devices because 1D nanostructures can have different heights, which can result in non-uniform mechanical stress from point to point in the material. It is possible that the nanostructures in the present piezoelectric nanogenerator can have different heights, as can be seen in the illustrated embodiment (see FIG. 2).

Figure 5A:
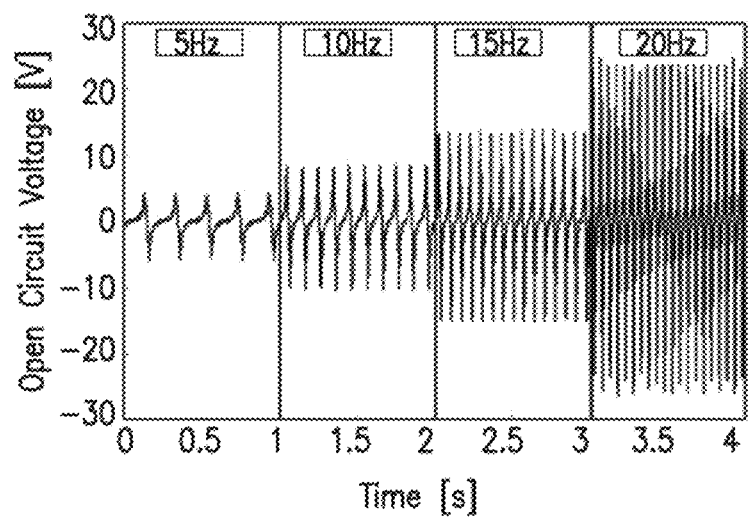
FIGS. 5a and 5b illustrate preliminary experimental results of (a) the output open circuit voltage (shown in FIG. 5a) and (b) the short circuit current at different frequencies (shown in FIG. 5b) of the preferred embodiment of the piezoelectric nanogenerator illustrated in FIGS. 1a and 2a-2c when the force is kept at about 5 N and the hammer peak-to-peak displacement is 5 mm.
Figure 5B:
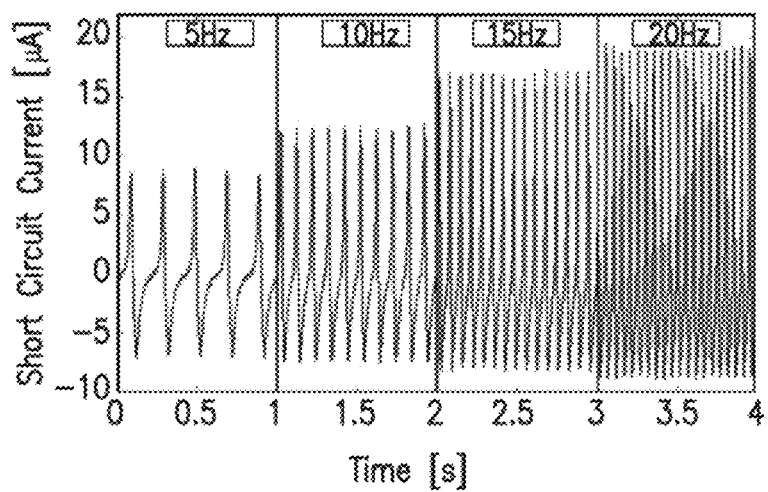

FIGS. 5a and 5b illustrate the output open circuit voltages and short circuit currents, respectively, obtained from the illustrated embodiment of the present piezoelectric nanogenerator, at different frequencies when the force was kept fixed at ~5 N and the hammer peak-to-peak displacement was 5 mm.

Since the impact acceleration on the piezoelectric nanogenerator increases as the frequency increases at constant force, the output piezopotential increases and eventually enhances the output open circuit voltage and current [27].

Figure 6A:
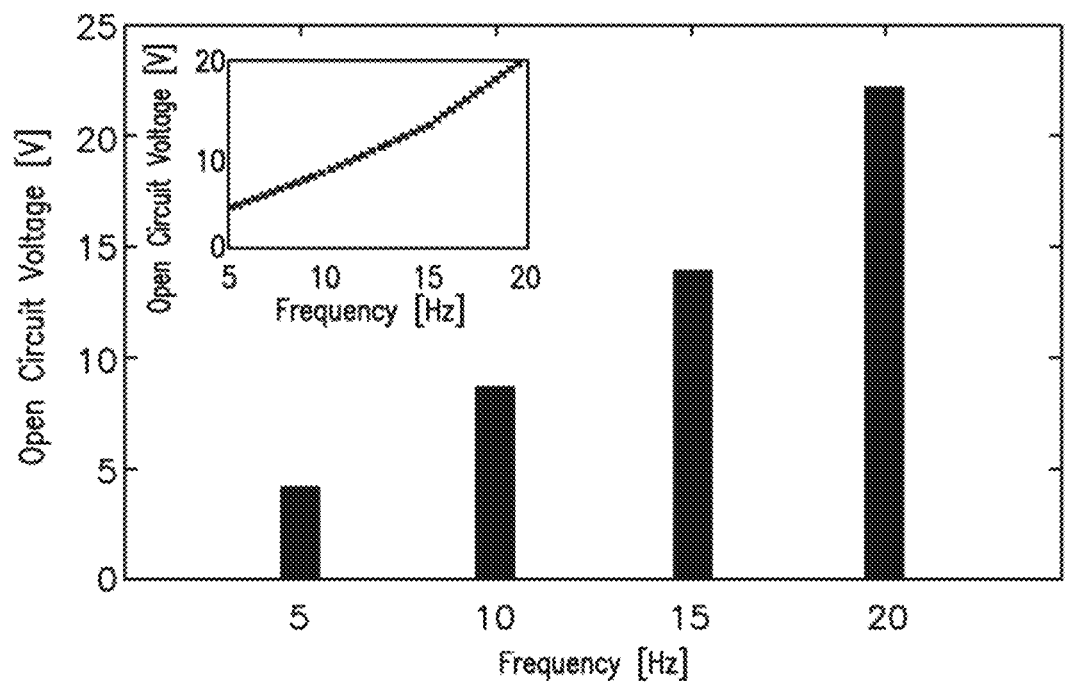
FIGS. 6a and 6b illustrates preliminary experimental results of (a) the average peak output open circuit voltages (shown in FIG. 6a) and (b) the average peak output short circuit current (shown in FIG. 6b) of the preferred embodiment of the piezoelectric nanogenerator illustrated in FIGS. 1a and 2a-2c at different frequencies.
Figure 6B:
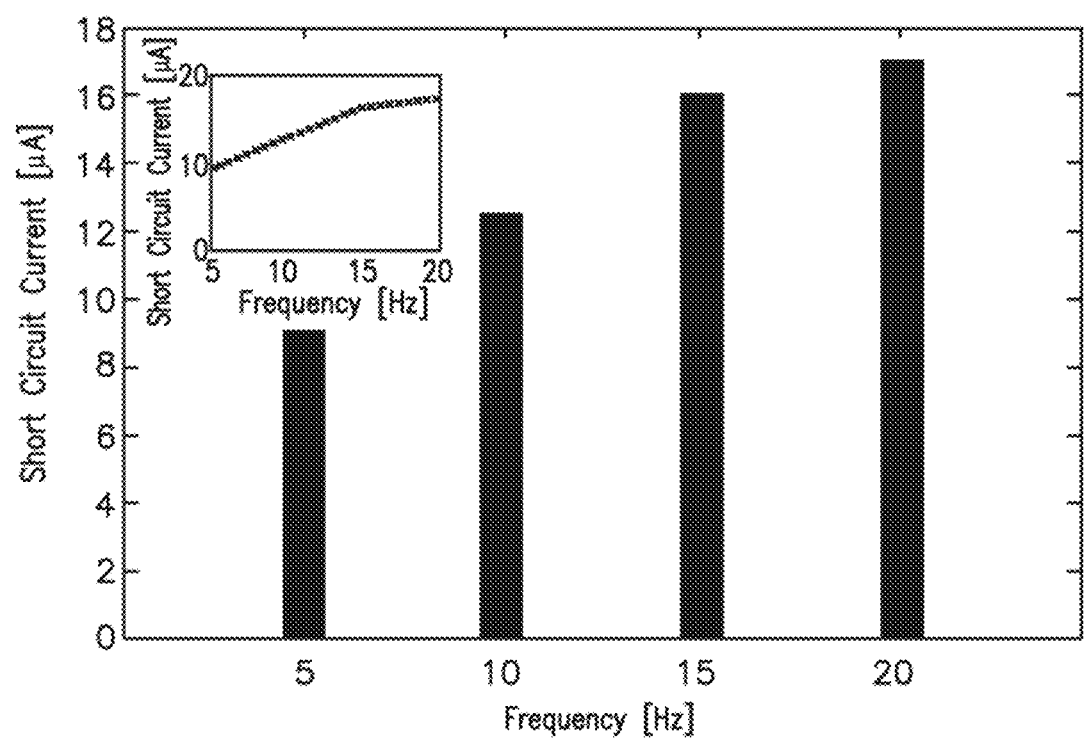

FIGS. 6a and 6b illustrate the average open circuit voltages and short circuit currents, respectively, obtained from the illustrated embodiment of the present invention, at 5 Hz, 10 Hz, 15 Hz, and 20 Hz, which showed a liner relationship of both the open circuit voltage and short circuit current with frequency.

Figure 7A:
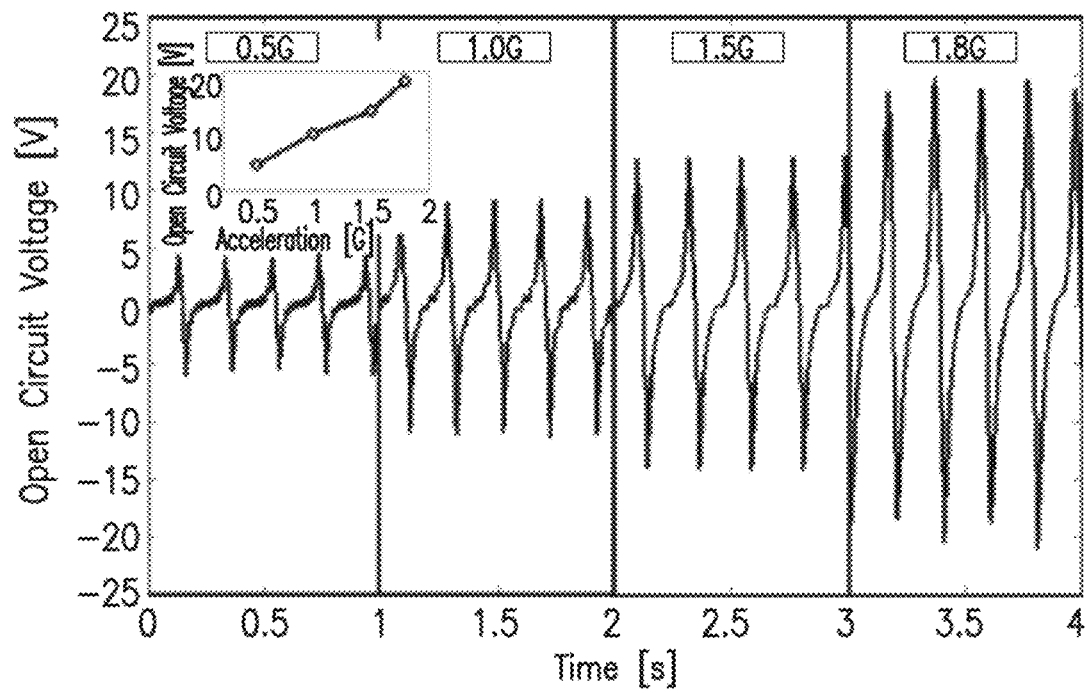
FIGS. 7a and 7b illustrates preliminary experimental results of (a) the output open circuit voltage (shown in FIG. 7a) and (b) the output short circuit current (shown in FIG. 7b) of the preferred embodiment of the piezoelectric nanogenerator illustrated in FIGS. 1a and 2a-2c at different acceleration levels when the force and the frequency are fixed at about 5 N and 5 Hz, respectively.
Figure 7B:
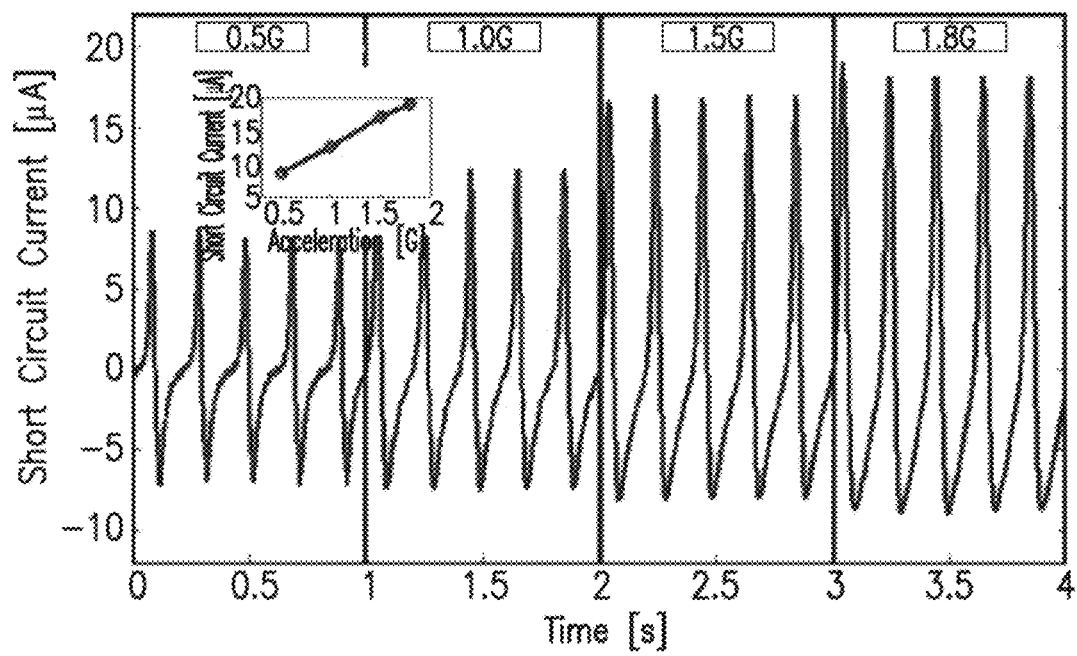

FIGS. 7a and 7b illustrate the output open circuit voltages and short circuit currents, respectively, obtained from the illustrated embodiment of the present piezoelectric nanogenerator, at different acceleration levels when the force and the frequency were kept fixed at ~5 N and 5 Hz respectively.

The average peak output voltage and current increased linearly with the applied acceleration as shown in FIG. 7a and FIG. 7b insets. This can likely be attributed to the fact that at 5 Hz, the piezoelectric nanogenerator was below the resonant vibration frequency, at above 5 Hz, the output voltage and current still increased linearly as shown by the voltage and current changing trends in FIGS. 6a and 6b insets, and when a piezoelectric nanogenerator operates below its resonant frequency, the output voltage and current show a linear dependence on the acceleration level [37].

When the excitation frequency approaches the resonance frequency, the output becomes saturated and beyond the resonant frequency, the output drops quickly [38-39]. However, since the frequencies of environmental vibration sources are relatively low [40], the present piezoelectric nanogenerator is unlikely to reach its resonant frequency and is therefore capable of producing enhanced piezopotential. In addition, when the present piezoelectric nanogenerator is excited and deflected with higher acceleration amplitudes and higher frequencies, not only do the longer 1D nanostructures experience larger deformation but also the shorter 1D nanostructures get enough deformation to give rise to piezoelectric potential [27]. This can effectively increase the output voltage and current, hence the total output power of the piezoelectric nanogenerator in both the frequency and acceleration sweeps.

Figure 8:
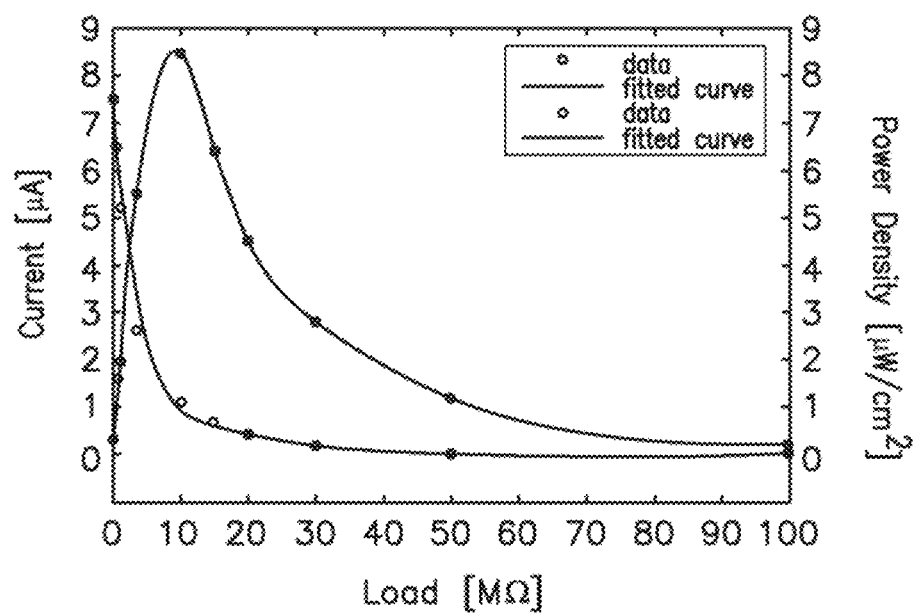
FIG. 8 illustrates preliminary experimental results of the electrical output performance of the preferred embodiment of the piezoelectric nanogenerator illustrated in FIGS. 1a and 2a-2c.

FIG. 8 illustrates the electrical output performance of the illustrated embodiment of the present piezoelectric nanogenerator to the external load, which was systematically investigated by connecting variable resistances from 10 kΩ to 200 MΩ.

The maximum power density of 8.4 $\mu W/cm^2$ was achieved with an external load of 10 MΩ. This is likely because the current decreases with an increase of load resistance owing to the ohmic loss [41], as shown in FIG. 8, and instantaneous maximum power value was achieved when the load resistance matched with the internal resistance of the piezoelectric nanogenerator. The internal resistance for this kind of vertical nanowire array integrated nanogenerator (VING) is several MΩ [13].

Thus, the above exemplary work performed by the present inventors demonstrates a piezoelectric nanogenerator, comprising 1D and 2D nanostructures integrated together. These nanostructures are grown on the same substrate using a simple, low temperature hydrothermal method. The resulting piezoelectric nanogenerator combines the advantages of PENGs based on 1D nanostructures (e.g. high electromechanical coupling) with the advantages of PENGs based on 2D nanostructures (e.g. high mechanical stability). The composite nanostructure of the present piezoelectric nanogenerator provides enhanced performance in terms of its electrical output as well as mechanical stability, as compared to previously reported piezoelectric nanogenerators that comprise 1D nanostructures or 2D nanostructures alone.

The illustrated embodiment of the present piezoelectric nanogenerator was tested under different mechanical stresses with different applied frequencies and acceleration levels which demonstrated the robustness of the device. The output open circuit voltage and short circuit current was found to be almost identical in each cycle of mechanical force under the same measurement condition. At a force of 5 N and with a frequency of 5 Hz, the average peak-to-peak open circuit voltage and short circuit current reached up to 10.18 V and 15.9 µA, respectively, which corroborates the prospective of the present piezoelectric nanogenerator to power up an array of sensors in an aircraft SHM system and hence making the aircraft SHM system self-powered. With its enhanced output performance and mechanical robustness, the present piezoelectric nanogenerator is believed to also have application in any device in which a self-powered device may be advantageous, such as wearable electronic devices, medical diagnostic devices, and implantable devices.

Figure 9A:
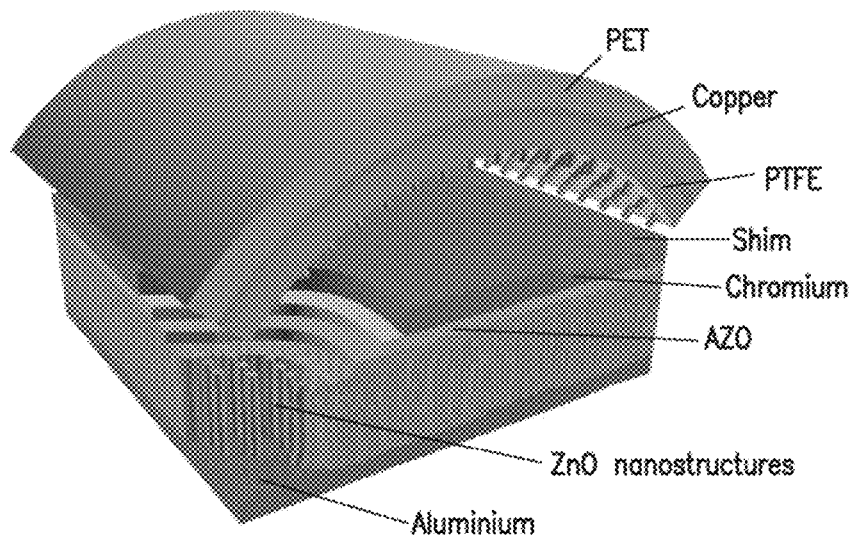
FIG. 9a illustrates a perspective view of a 3D schematic of a second embodiment, in which a piezoelectric nanogenerator similar to that illustrated in FIG. 1a is combined with a triboelectric nanogenerator to form a hybrid piezoelectric-triboelectric nanogenerator device.

3. Piezoelectric-Triboelectric Nanogenerator Device 3.1 Device Structure and Working Principle In another embodiment, the present piezoelectric nanogenerator (hereinafter referred to as the "piezoelectric component") is combined with a triboelectric nanogenerator (hereinafter referred to as the "triboelectric component") to form a hybrid piezoelectric-triboelectric nanogenerator device. FIG. 9a illustrates a 3D schematic of a curved shaped triboelectric component integrated on top of a flat shaped piezoelectric component.

In the illustrated embodiment of the present hybrid device, the piezoelectric component was fabricated on a 2.5 cm×2 cm shim substrate. The shim substrate was an alloy with the following material compositions: aluminium (99.29%), zinc (0.04%), manganese (0.04%), silicon (0.13%), iron (0.48%), other (0.02%).

As illustrated in FIG. 9a, the piezoelectric component of the illustrated embodiment consisted of aluminium/p-n junction type ZnO nanostructures covered with PMMA, AZO, chromium, and a nanostructured shim substrate (components listed in order when moving up from the bottom of the device) and the triboelectric component consisted of polyethylene terephthalate (PET), copper, polytetrafluoroethylene (PTFE) with nanostructures on the surface, and the nanostructured shim (components listed in order when moving down from the top of the device). To simultaneously utilize the responses of the piezoelectric and triboelectric components, the nanostructured shim substrate was used as a common electrode.

As used herein, the term "triboelectric series" refers to a listing in which materials are ordered based on their empirically derived direction of charge tendency. For example, conventional triboelectric series are provided by Kim et al. (RSC Adv. 2017, 7: 49368-49373) and AlphaLab Inc. (https://www.alphalabinc.com/triboelectric-series/). A material that is closer to the top of the list will charge positively (i.e., lose electrons) when contacted with a material closer to the bottom of the list, which will charge negatively (i.e., gain electrons).

While in the illustrated embodiment, the triboelectric component comprises PTFE as the triboelectric layer, the triboelectric layer can be any material that is at a different position on a triboelectric series than the first electrode, such that when the triboelectric layer comes into contact with the first electrode, electrons are exchanged. For example, the triboelectric layer may comprise polydimethylsiloxane (PDMS), polyvinyl chloride (PVC), polyethylene (PE), polystyrene (PS), or silicon rubber.

While not wishing to be bound by any particular theory or mode of action, FIG. 10 illustrates a working mechanism of the illustrated hybrid piezoelectric-triboelectric device that is based on a vertical press-and-release mechanism.

At the initial state (illustrated in FIG. 10a), as the nanostructured shim surface and the PTFE surface are not in contact, there is no triboelectric-induced charge accumulation, and hence no triboelectric output. Also, at this stage, since the ZnO nanostructures are not strained, they do not have a piezoelectric charge distribution, so no piezoelectric potential exists.

As illustrated in FIG. 10b, when an external compression force is applied to the device, the top PTFE layer of the triboelectric component starts to move closer to the nanostructured shim surface and when the PTFE layer and shim surface come into contact, there is a charge transfer between the two layers. Since aluminium is higher in the triboelectric series than PTFE, electrons are transferred from the shim electrode to the copper electrode in the triboelectric component, which causes a current flow from the copper electrode to the shim electrode through the external load. At the same time, as the ZnO nanostructures in the piezoelectric component are vertically strained due to the external applied force, one side of the nanostructures becomes positively charged (at the AZO/n-ZnO interface) and the other becomes negatively charged (the p-ZnO/PMMA interface). Due to this negative piezopotential (V−) at the p-ZnO/PMMA interface and positive piezopotential (V+) at the AZO/n-ZnO interface, electrons flow from the shim electrode to the aluminium electrode of the piezoelectric component, resulting in a current flowing in the opposite direction through the external load.

When the device is fully pressed, the charges in the piezoelectric and triboelectric components reach an equilibrium, which drives the piezoelectric and triboelectric outputs to zero. This is illustrated in FIG. 10c.

As illustrated in FIG. 10d, once the external applied force is released, the elastic property of the PET layer of the triboelectric component causes the PTFE layer to move away from the shim electrode, which drives the electrons back from copper electrode to the shim electrode through the external load (i.e., opposite to the electron flow during the compressed state). This causes a current to flow in the opposite direction, resulting in an AC signal for the complete cycle. At the same time, as the strain is released, the piezopotential in the ZnO nanostructure arrays fades away, causing the electrons around the aluminium electrode to flow back to the shim electrode via the external load (i.e., opposite to the current flow during the compressed state). The piezoelectric and triboelectric components then reach equilibrium, yielding zero output.

Figure 9B:
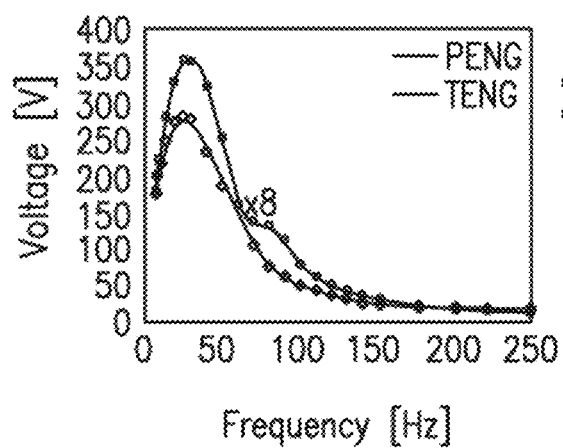
FIG. 9b illustrates the average peak-to-peak output open circuit voltage from the piezoelectric and triboelectric components of the hybrid device illustrated in FIG. 9a at different frequencies.
Figure 9C:
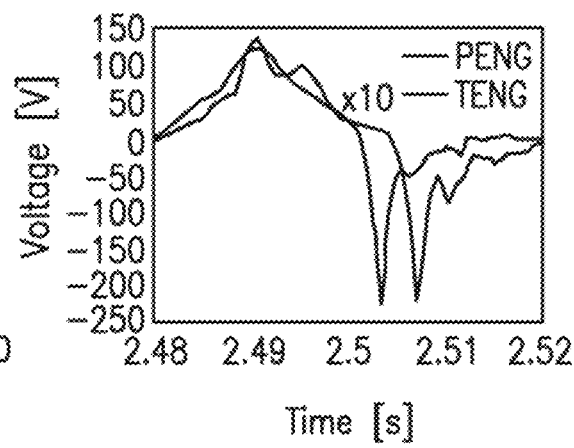
FIG. 9c illustrates the output open circuit voltage from the piezoelectric and triboelectric components in a single press-and-release cycle of the hybrid device illustrated in FIG. 9a at a frequency of 25 Hz.

FIG. 9c illustrates the simultaneous piezoelectric and triboelectric output signals within one press-and-release cycle.

3.2 Device Fabrication

FIGS. 11a through 11l illustrate a step-by-step fabrication of the illustrated hybrid piezoelectric-triboelectric nanogenerator device. The fabrication of the device can be divided into two parts: the piezoelectric component and the triboelectric component.

Figure 12A:
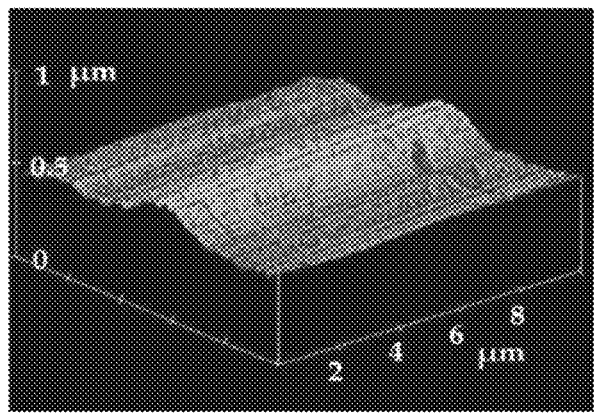

In the illustrated embodiment, a 2.5 cm×2 cm piece of shim was cut. The shim acted as the substrate material. The shim substrate was cleaned using standard cleaning process and then atomic force microscopy was used to determine the surface roughness of the substrate. The measured surface roughness of the substrate of the present invention can be any value that allows for subsequent ZnO nanostructure growth. FIG. 12a illustrates the 3D topography of the substrate surface of the illustrated embodiment of the device, where the measured surface roughness was 45 nm.

Figure 12B:
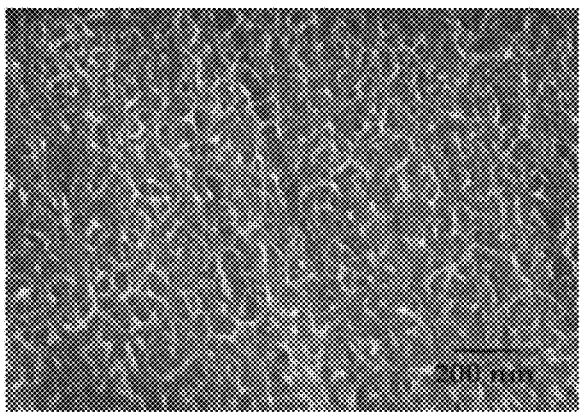

To form nanostructures on one of the surfaces of the shim substrate, the surface to be nanostructured was immersed in DI water at a temperature of 120° C. for 30 minutes while the other surface was covered with Kapton™ tape to prevent contact with the DI water. FIG. 12b illustrates the shim substrate surface after DI water treatment. By creating a nanostructured surface on the shim, the friction between the shim layer of the piezoelectric component and the PTFE layer of the triboelectric component may be increased, which may in turn enhance the triboelectric charge density.

The piezoelectric component was based on 1D/2D hybrid ZnO nanostructures which were grown using the low temperature hydrothermal method described above with the following differences:

the structure was fabricated on a 2.5×2 cm² shim substrate;

the AZO layer, which served as the seed layer for the hydrothermal growth of the 1D and 2D ZnO nanostructures, was 200 nm thick; and the growth time of the nanostructures was adjusted to three (3) hours.

Figure 12C:
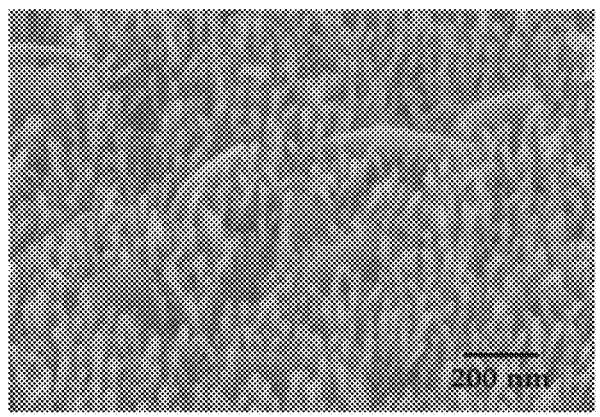

FIG. 12c illustrates the ZnO nanowires with an average diameter of 70 nm along with the ZnO nanoplates with an average thickness 50 nm.

Figure 12D:
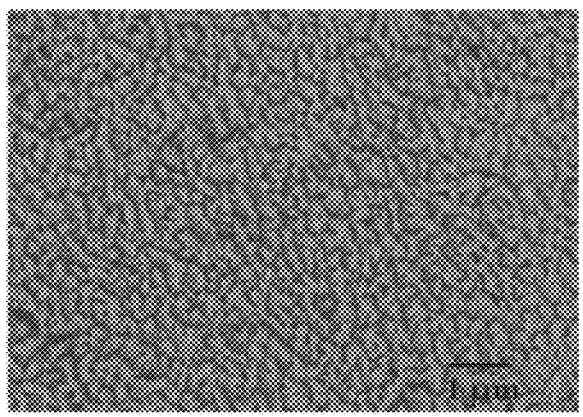

For the triboelectric component, a 2.5 cm×2 cm piece of 50 µm thick PTFE was cleaned using standard process and a 10 nm gold layer was deposited using electron beam evaporation. Next, inductively coupled plasma-reactive ion etching was applied to the PTFE to create nanostructures on the surface. An SEM image of the top surface of the nanostructured PTFE of the present embodiment is shown in FIG. 12(d). As seen in FIG. 12d, there was a uniform formation of nanostructures on the PTFE surface. The nanostructures on the PTFE may act to further enhance the triboelectric charge density.

After the formation of the nanostructures on the surface of the PTFE, copper was deposited on the PTFE using electron beam evaporation. While in the illustrated embodiment, the triboelectric electrode comprises copper, the triboelectric electrode can be any metal with a good electrical conductivity. For example, the triboelectric electrode may comprise copper, gold, or aluminium.

In the illustrated embodiment, the PTFE was glued to an arc-shaped PET substrate with double sided copper tape. The PET substrate was precleaned using standard process and the arc shape was made using heat treatment.

The piezoelectric and triboelectric components were then integrated by Kapton™ tape to complete the device, as illustrated in FIGS. 11a through 11l. Three copper wires were connected to the three electrodes (shim and aluminum electrodes on the piezoelectric component and copper electrode on the triboelectric component) for the characterization of the device.

3.3 Optimized Operating Frequency for Device Characterization

Before starting the device characterization, the optimized operating frequency of the illustrated embodiment of the device was determined by sweeping the frequency of the applied mechanical vibration from 1 Hz to 250 Hz, as shown in FIG. 9b. It was found that both the piezoelectric component and the triboelectric component yielded the highest output voltage at 25 Hz. As such, the subsequent measurements discussed below were performed at this frequency unless otherwise mentioned.

3.4 Results and Discussion

In the illustrated embodiment, it was found that integrating the present piezoelectric nanogenerator with a triboelectric nanogenerator enhanced the energy conversion efficiency of the resulting hybrid piezoelectric-triboelectric nanogenerator device, as compared to the piezoelectric and triboelectric components on their own.

Figure 13:
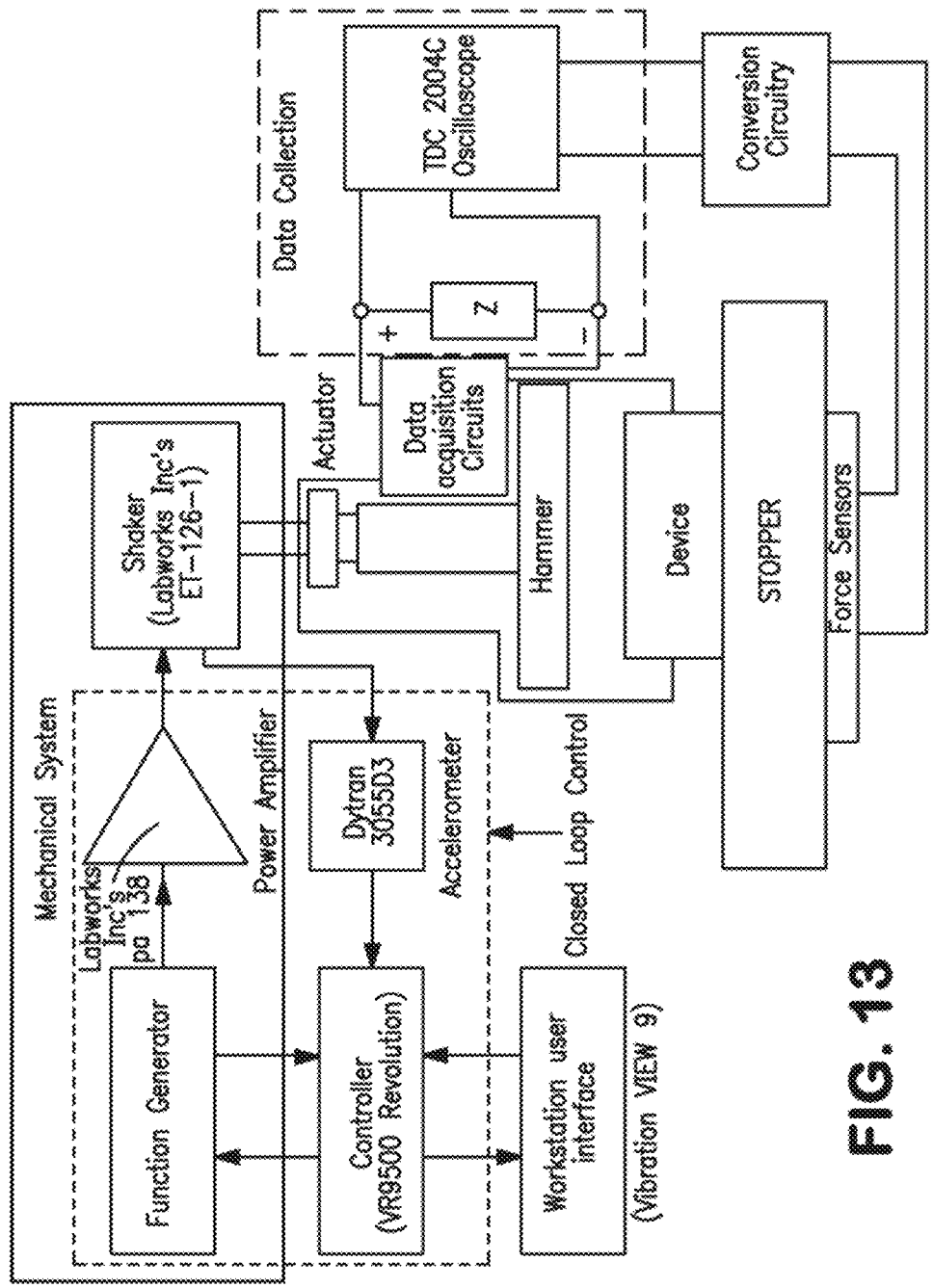
FIG. 13 is a block diagram that illustrates a schematic of a set-up of a material characterization system.

After the packaging of the hybrid device in the illustrated embodiment, the device was tested using a characterization set up, as shown in FIG. 13, to obtain quantitative information about the piezoelectric response of the device for a particular amount of applied vertical strain on top of the device with a particular acceleration and known frequency.

Figure 14A:
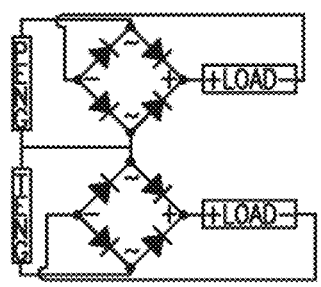
Figure 14B:
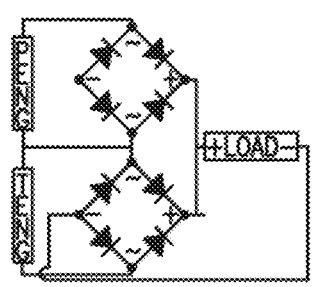

The piezoelectric and triboelectric components were combined in parallel (the so-called "hybrid operation mode"). To account for a possible mismatch between the internal resistances of the piezoelectric and triboelectric components, as well as to minimize voltage cancellation that may occur due to phase differences between the voltages of the two components, two bridge rectifier units were used to collect the electrical signals from the two components (FIG. 14a) as well as from their hybrid operation mode (FIG. 14b). Full-wave bridge rectifiers may prevent voltage degradation due to the different internal resistances and may eliminate the voltage cancellation effect from the phase mismatch [43, 44].

Figure 14C:
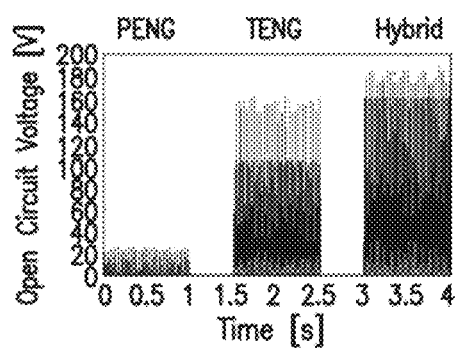
Figure 14D:
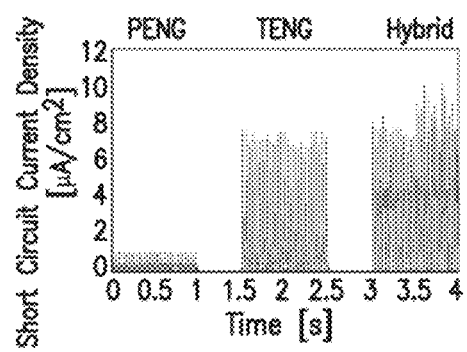

FIGS. 14c and 14d illustrate the rectified piezoelectric, triboelectric, and hybrid open-circuit voltages and short-circuit currents under a periodic mechanical vibration at 25 Hz frequency, 1 G acceleration, and 5 mm peak-to-peak hammer displacement. When the two components of the device were connected as shown in FIG. 14a, the output voltages were essentially the rectified voltages from two separate components, with an average peak voltage of ~25 V for the piezoelectric component and ~160 V for the triboelectric component. However, when the piezoelectric and triboelectric components were combined for hybrid operation mode (as shown in FIG. 14b), the measured output voltage reached an average peak value of ~186 V. This enhancement may result from the induced charges on the electrode caused by the triboelectric or the piezoelectric charges, in addition to the original piezoelectric or triboelectric output.

As illustrated in FIG. 14d, the piezoelectric component, triboelectric component, and their hybrid operation mode produced an average short circuit current of ~1.04 $\mu A/cm^2$, ~7.02 $\mu A/cm^2$ and ~8.1 $\mu A/cm^2$, respectively. The small fluctuation in the output signals may be attributed to small fluctuations in the effective mechanical vibration impacts from the mechanical part of the testing set-up. The measured short circuit current signals demonstrate that the currents from the two components are combined in the hybrid operation mode. As well, it should be noted that the device had a maximum output open-circuit voltage and short-circuit current density of 186 V and 10.02 $\mu A/cm^2$ respectively, which resulted a maximum output power of ~1.864 $mW/cm^2$.

In the illustrated embodiment, combining the present piezoelectric nanogenerator with a triboelectric nanogenerator into a single hybrid device enhanced the performance of each component, resulting in an energy harvesting capability that was greater that of the individual components. This enhanced output resulted from the interaction of the piezoelectric and triboelectric potentials. The enhanced output of each component consisted of two parts: (i) the original piezoelectric or triboelectric output, and (ii) the induced charges on the common electrode caused by the triboelectric charges or the piezoelectric potential. The illustrated experimental measurements demonstrated that the peak-to-peak output voltage of piezoelectric component increased from 34.8 V to 120 V. This may, at least in part, be attributable to the influence of the triboelectric charges. The peak-to-peak output voltage of triboelectric component also increased from 352 V to 420 V. This may, at least in part, be attributable to the induced charges on the common electrode caused by the strained ZnO nanostructures of the piezoelectric component.

The mutual output enhancement of the piezoelectric and triboelectric components of the device is shown in FIGS. 15a to 15d.

Figure 16A:
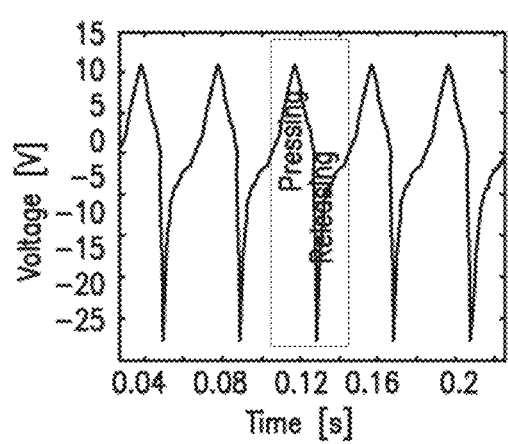
FIGS. 16a and 16b illustrate the measured output voltage signals of the piezoelectric component of the hybrid device illustrated in FIG. 9a in (a) a forward connection (shown in FIG. 16a) and (b) a reverse connection of the measurement instrument during testing to confirm that the output is generated by the piezoelectric effect of the ZnO nanomaterials (shown in FIG. 16b).
Figure 16B:
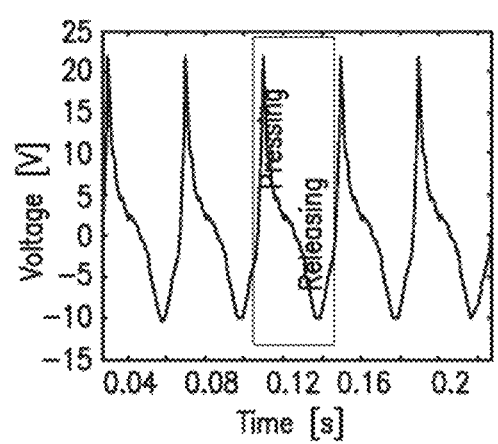

To assess if the measured output signals of the piezoelectric component of hybrid device were generated by the piezoelectric properties of the ZnO nanostructured materials, a switching polarity test [45] was conducted. As illustrated in FIGS. 16a and 16b, the polarity of the output signal was inverted when the connection of the measurement instrument was switched.

FIG. 17a illustrates load matching of the illustrated embodiment of the device, which was performed by varying the load resistor from 5Ω to 105 MΩ and measuring the corresponding voltages across different loads and currents through different loads. As illustrated in FIG. 17b, the power delivered to the load was calculated from the measured values of currents and voltages and plotted against different loads, which demonstrated that device yielded a maximum output power of 0.774 mW at a match load of 21 MΩ.

To further illustrate the output of the combined piezoelectric-triboelectric device over its individual components, a 4.7 µF capacitor was charged over 120 s using the piezoelectric component, triboelectric component, and hybrid operation mode of the illustrated embodiment of the hybrid device. As shown in FIG. 17c, in 120 s, the capacitor was charged up to 3.7 V by the piezoelectric component, up to 9.4 V by the triboelectric component, and up to 12 V by the hybrid operation mode. FIG. 17*d* illustrates the charging of other commercial capacitors by the hybrid operation mode of the device.

The following experiments were conducted to illustrate the use of the present hybrid device in self-powered, wearable devices. First, the illustrated embodiment of the hybrid device was placed under a wristband fitness tracker to harvest energy from normal hand movements. As shown in FIGS. 17*e* and 17*f*, the device produced an average peak-to-peak voltage of 160 V and charged a 1 µF and 2.2 µF commercial capacitor up to 3.6 V and 1.8 V, respectively, within 10 seconds. Next, the device was attached to the underside of a shoe to harvest energy from human walking. As shown in FIG. 17*g*, the device produced a maximum peak-to-peak output voltage of 672 V.

Figure 18:
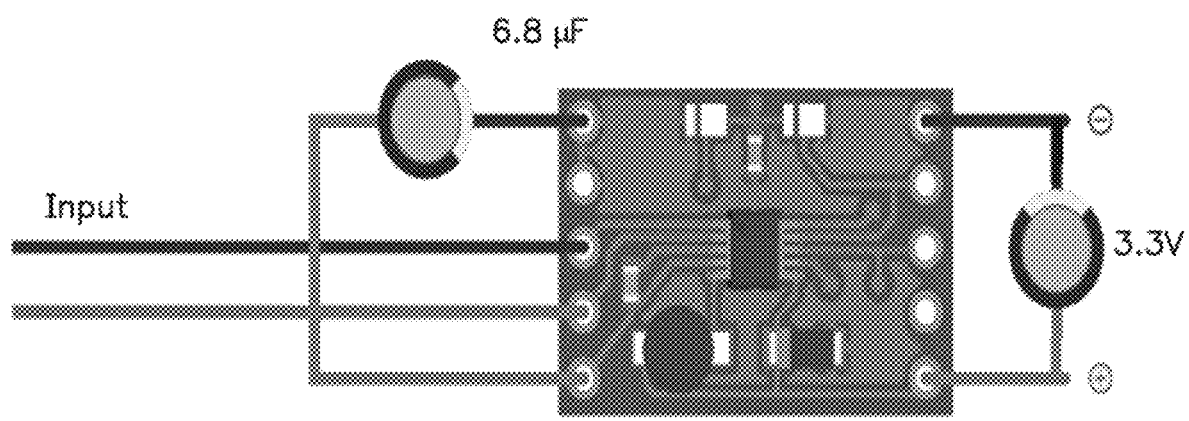
FIG. 18 illustrates a circuit diagram for energy collection from the hybrid device illustrated in FIG. 9a using Linear Technology's LTC3588-1LTC (Input side capacitor=6.8 μF and output side capacitor=47 μF).
Figure 19:
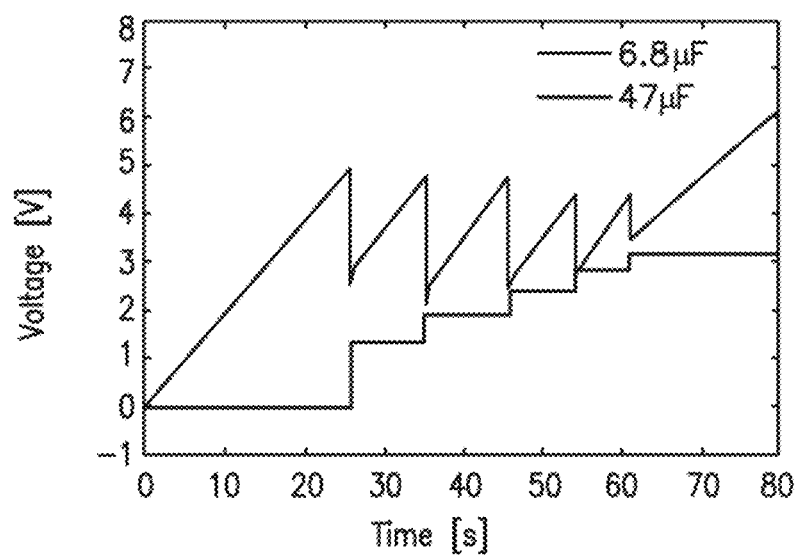
FIG. 19 illustrates energy collection of the embodiment of the hybrid device illustrated in FIG. 9a, using commercial piezoelectric energy harvesting unit with 6.8 μF and 47 μF capacitors in the input and output side, respectively.
Figure 20A:
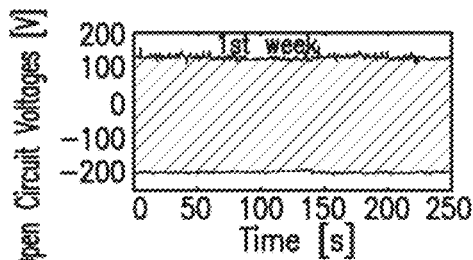
FIGS. 20a to 20h illustrate preliminary measured open-circuit voltage data of the hybrid device illustrated in FIG. 9a of the piezoelectric component (see FIGS. 20a to 20d) and the triboelectric component (see FIGS. 20e to 20h) tested over four consecutive weeks. The excitation frequency and acceleration amplitude were 25 Hz and 1 G, respectively, in all tests.
Figure 20B:
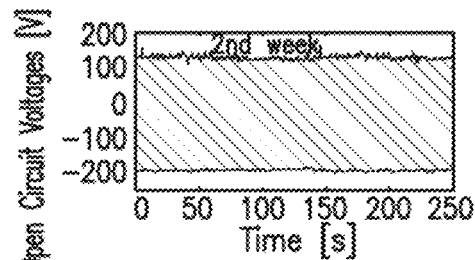
Figure 20C:
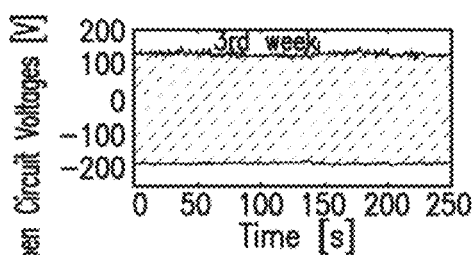
Figure 20D:
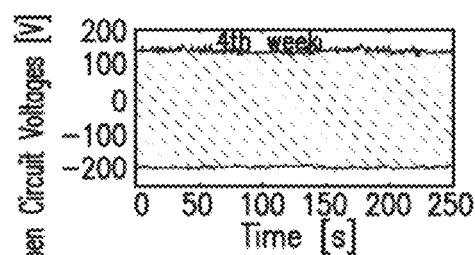
Figure 20E:
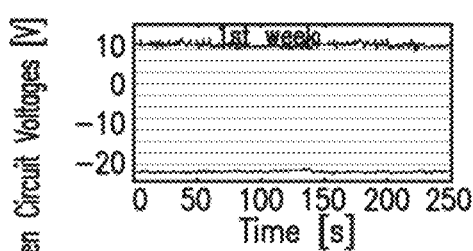
Figure 20F:
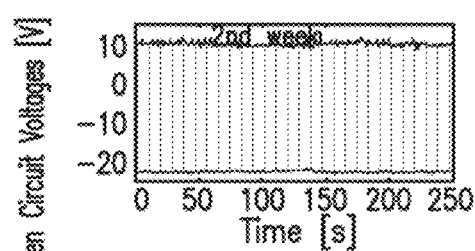
Figure 20G:
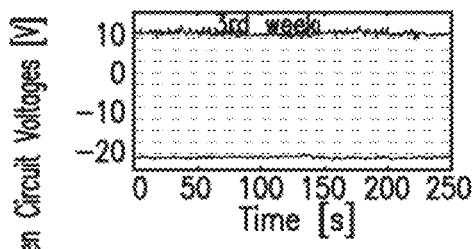
Figure 20H:
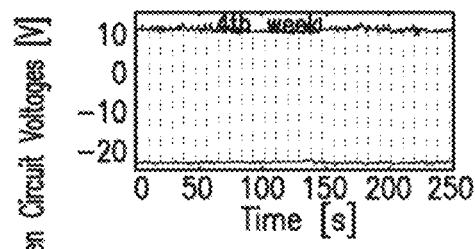

To illustrate the potential of the present hybrid device to power a wireless micro-controller unit (MCU) unit that is used to acquire, process, and transmit data [38], the illustrated embodiment of the hybrid device was used to collect energy using a commercial piezoelectric energy harvesting power supplies unit (Linear Technology's LTC3588-1LTC). The circuit connection used for the energy collection is shown in FIG. 18. As illustrated in FIG. 19, the output voltage of the output capacitor reached 3.3 V in 65 s.

To illustrate the long-term mechanical stability and reliability of the present hybrid device, the illustrated embodiment of the hybrid device was tested in over 200,000 press-and-release cycles over four consecutive weeks. As shown in FIGS. 20*a* to 20*d*, both the piezoelectric component and the triboelectric component of the device demonstrated consistent output voltage waveforms, with no perceivable performance degradation over time.

The piezoelectric and triboelectric components of the present hybrid device work together in a single press-and-release cycle to enhance output open circuit voltage, short circuit current, and therefore output power density, as compared to the individual outputs of the piezoelectric and triboelectric components on their own. With its enhanced output and fast charging capabilities, together with its long-term stability and robustness, the present hybrid device is believed to have application in the field of self-powered systems and sensor network.

While this invention has been described with reference to illustrative embodiments and examples, the description is not intended to be construed in a limiting sense. Thus, various modifications of the illustrative embodiments, as well as other embodiments of the invention, will be apparent to persons skilled in the art upon reference to this description. It is therefore contemplated that the appended claims will cover any such modifications or embodiments.

All publications, patents and patent applications referred to herein are incorporated by reference in their entirety to the same extent as if each individual publication, patent, or patent application was specifically and individually indicated to be incorporated by reference in its entirety.

What is claimed is:

1. A piezoelectric nanogenerator comprising:
a substrate;
a first electrode element;
a second electrode element; and
a composite nanostructure interposed between and in electrical contact with the first and second electrode elements, wherein the composite nanostructure comprises a plurality of 1D nanostructures integrated with a plurality of 2D nanostructures, wherein the plurality of 1D nanostructures and the plurality of 2D nanostructure have piezopotential, wherein the composite nanostructure of the plurality of 1D nanostructures and the plurality of 2D nanostructures are coated in an in an insulating buffer layer embedding the plurality of 1D nanostructures and the plurality of 2D nanostructures within buffer material,
wherein the plurality of 1D nanostructure are at least one of nanowires and nanorods; and wherein the 2D nanostructures are at least one of nanoplates, nanosheets, nanowalls, and nanodisks, and
wherein at least one of the first electrode element and the second electrode element are configured to receive an external mechanical force and compress the composite nanostructure to convert mechanical energy into electricity to power a device.

2. The piezoelectric nanogenerator defined in claim 1, wherein the substrate comprises a polymer.

3. The piezoelectric nanogenerator defined in claim 1, wherein the substrate comprises an alloy, wherein the alloy comprises aluminum.

4. The piezoelectric nanogenerator defined in claim 3, wherein the alloy comprises, zinc, manganese, silicon, and iron.

5. The piezoelectric nanogenerator defined in claim 1, wherein the substrate is coated with a catalyst layer comprising chromium.

6. The piezoelectric nanogenerator defined in claim 1, wherein the piezoelectric nanogenerator further comprises a seed layer deposited on the substrate, the seed layer comprising a compound configured to promote growth of the plurality of 1D nanostructures and the plurality of 2D nanostructures, wherein the compound is zinc oxide.

7. The piezoelectric nanogenerator defined in claim 1, wherein the substrate and the first electrode element are integral.

8. The piezoelectric nanogenerator defined in claim 1, wherein at least one of the plurality of 1D nanostructures and the plurality of 2D nanostructures comprises zinc oxide.

9. The piezoelectric nanogenerator defined in claim 1, wherein the plurality of 1D nanostructure comprises nanowires and nanorods.

10. The piezoelectric nanogenerator defined in claim 1, wherein the 2D nanostructure comprises nanoplates, nanosheets, nanowalls, and nanodisks.

11. The piezoelectric nanogenerator defined in claim 1, wherein the 1D and 2D nanostructures are co-mingled.

12. The piezoelectric nanogenerator defined in claim 1, wherein the buffer material comprises poly-methyl methacrylate (PMMA).

13. A hybrid nanogenerator device comprising:
a) the piezoelectric nanogenerator defined in claim 1, and
b) a triboelectric nanogenerator,
wherein the piezoelectric nanogenerator and the triboelectric nanogenerator are integrated.

14. The hybrid nanogenerator device defined in claim 13, wherein the triboelectric nanogenerator comprises:
a) a triboelectric layer having a contacting side and an opposite backing side, the triboelectric layer comprising a material that has a first position on a triboelectric series; and
b) an electrode layer disposed along the opposite backing side of the triboelectric layer;
wherein the triboelectric layer is configured such that it is spaced apart from the first electrode element and is configured to contact the first electrode element when a compressive force is applied to the hybrid nanogenerator device, the first electrode element comprising a material that has a second position on the triboelectric series that is different from the first position of the triboelectric layer.

15. The hybrid nanogenerator device defined in claim 14, wherein the triboelectric nanogenerator further comprises a mechanical support layer, the mechanical support layer being secured to the electrode layer opposite to the triboelectric layer.

16. The hybrid nanogenerator device defined in claim 14, wherein a top surface of the first electrode element comes into contact with the triboelectric layer, the top surface of the first electrode element comprising nanostructures, wherein the triboelectric layer comprises nanostructures on the contacting side.

17. A piezoelectric nanogenerator comprising a laminate structure having the following elements:
   a) a substrate;
   b) a first electrode element;
   c) a plurality of 1D nanostructures;
   d) a plurality of 2D nanostructures;
   e) a second electrode element;
   wherein the plurality of 1D nanostructure and the plurality of 2D nanostructure are integrated together to form a composite nanostructure, wherein the plurality of 1D nanostructures and the plurality of 2D nanostructure have piezopotential, wherein the composite nanostructure of the plurality of 1D nanostructures and the plurality of 2D nanostructures are coated in an in a insulating buffer layer embedding the plurality of 1D nanostructures and the plurality of 2D nanostructures within buffer material;
   wherein the composite nanostructure is in electrical contact with both the first electrode element and the second electrode element,
   wherein the plurality of 1D nanostructure are at least one of nanowires and nanorods; and wherein the 2D nanostructures are at least one of nanoplates, nanosheets, nanowalls, and nanodisks, and
   wherein at least one of the first electrode element and the second electrode element are configured to receive an external mechanical force and compress the composite nanostructure to convert mechanical energy into electricity to power a device.

18. The piezoelectric nanogenerator defined in claim 1, wherein the composite nanostructure comprises a 1D p-n junction type zinc oxide nanostructure integrated with the 2D nanostructure.

19. The piezoelectric nanogenerator defined in claim 17, wherein the composite nanostructure comprises a 1D p-n junction type zinc oxide nanostructure integrated with the 2D nanostructure.

* * * * *